United States Patent
Sharma

(10) Patent No.: US 11,521,967 B2
(45) Date of Patent: Dec. 6, 2022

(54) MULTI-FINGER DEVICES WITH REDUCED PARASITIC CAPACITANCE

(71) Applicant: STMicroelectronics International N.V., Geneva (CH)

(72) Inventor: Vishal Kumar Sharma, Delhi (IN)

(73) Assignee: STMicroelectronics International N.V., Geneva (CH)

(*) Notice: Subject to any disclaimer, the term of this patent is extended or adjusted under 35 U.S.C. 154(b) by 161 days.

(21) Appl. No.: 16/908,899

(22) Filed: Jun. 23, 2020

(65) Prior Publication Data

US 2020/0411510 A1  Dec. 31, 2020

Related U.S. Application Data

(60) Provisional application No. 62/868,091, filed on Jun. 28, 2019.

(51) Int. Cl.
  *H01L 27/085* (2006.01)
  *H01L 29/739* (2006.01)
  (Continued)

(52) U.S. Cl.
  CPC ........ *H01L 27/085* (2013.01); *H01L 23/4824* (2013.01); *H01L 29/0649* (2013.01); *H01L 29/7391* (2013.01)

(58) Field of Classification Search
  CPC ............... H01L 27/085; H01L 23/4824; H01L 29/0649; H01L 29/7391; H01L 27/0255
  See application file for complete search history.

(56) References Cited

U.S. PATENT DOCUMENTS 6,376,351 B1 * 4/2002 Tsai ................ H01L 21/823443
                                              257/E21.627
6,728,942 B2   4/2004 Lampaert et al.
(Continued)

FOREIGN PATENT DOCUMENTS

WO   2005065385 A2   7/2005

OTHER PUBLICATIONS

Kaija, T., et al: "Novel Study of Influence of Gate Layout Geometries on RF Cascode nMOSFET Transit Frequency," Physica Scripta. vol. T114, 213-216, 2004.
(Continued)

*Primary Examiner* — Jonathan Han
(74) *Attorney, Agent, or Firm* — Crowe & Dunlevy

(57) ABSTRACT

A substrate has an active area including first and second doped regions separated by portions of the substrate. Gates are located over the active area, each gate formed extending over a portion of the substrate separating adjacent first and second doped regions. A length of the doped regions is greater than other devices within the substrate that have a same gate oxide thickness. A first metallization layer has first electrical connectors between each of the first doped regions and a gate immediately adjacent thereto, and second electrical connectors connected to each of the second doped regions. A second metallization layer has a first electrical connector connected to each first electrical connector of the first metallization layer, and a second electrical connector connected to each second electrical connector of the first metallization layer, with the second electrical connector of the second metallization layer not overlapping the gates.

31 Claims, 13 Drawing Sheets

(51) Int. Cl.
    *H01L 29/06*      (2006.01)
    *H01L 23/482*    (2006.01)

(56) References Cited

U.S. PATENT DOCUMENTS

| | | | |
|---|---|---|---|
| 8,178,908 B2 * | 5/2012 | Greenberg | H01L 23/4824 |
| | | | 257/386 |
| 9,448,679 B2 | 9/2016 | Lee | |
| 2018/0040605 A1 * | 2/2018 | Zhou | H01L 29/42372 |
| 2020/0075751 A1 * | 3/2020 | Hong | H01L 29/8611 |

OTHER PUBLICATIONS

Ker, Ming-Dou, et al: "ESD Protection Design for CMOS RF Integrated Circuits Using Polysilicon Diodes," Pergamon, Microelectronics Reliability 42 (2002) 863-872.

* cited by examiner

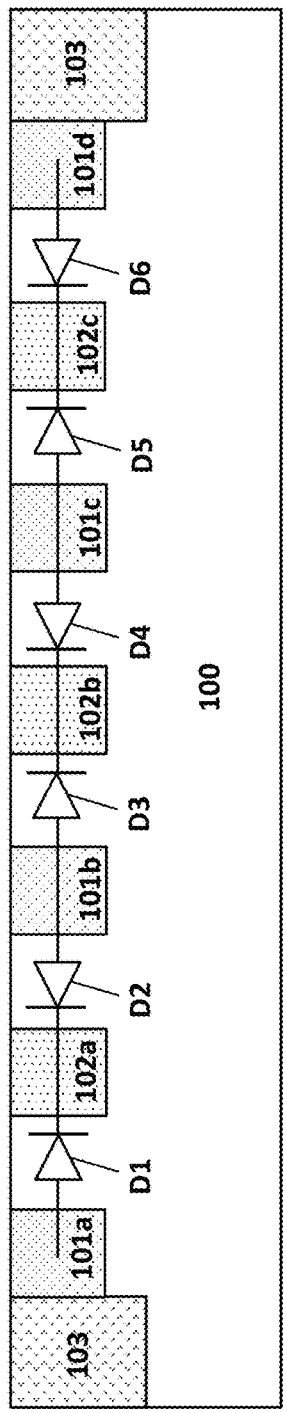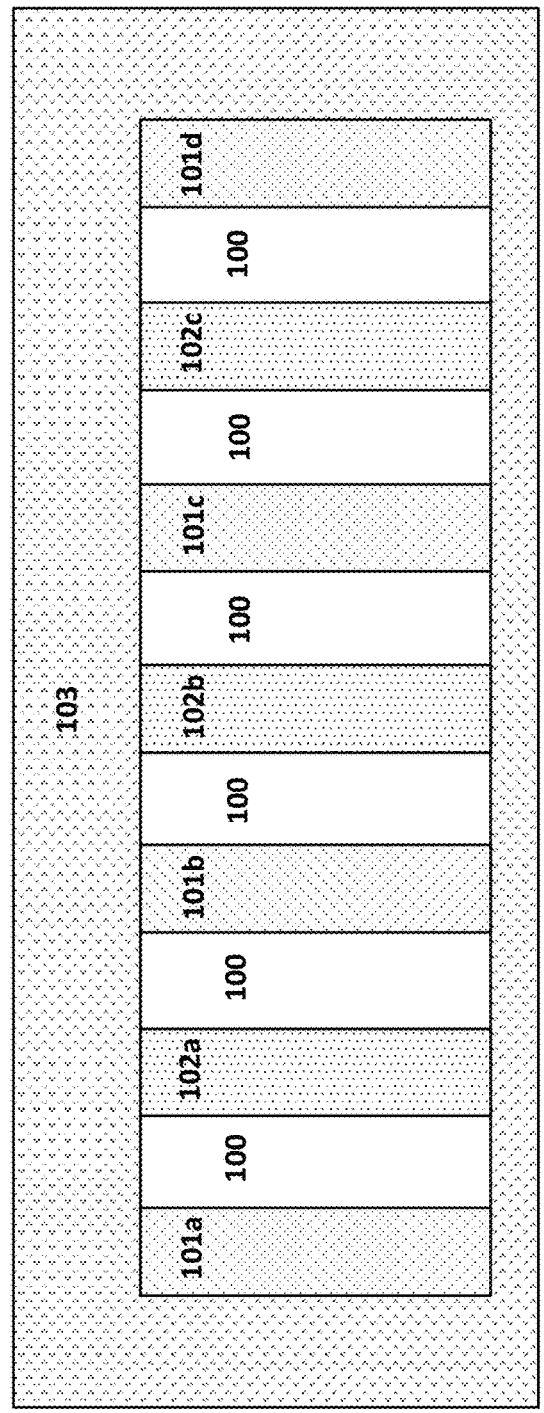

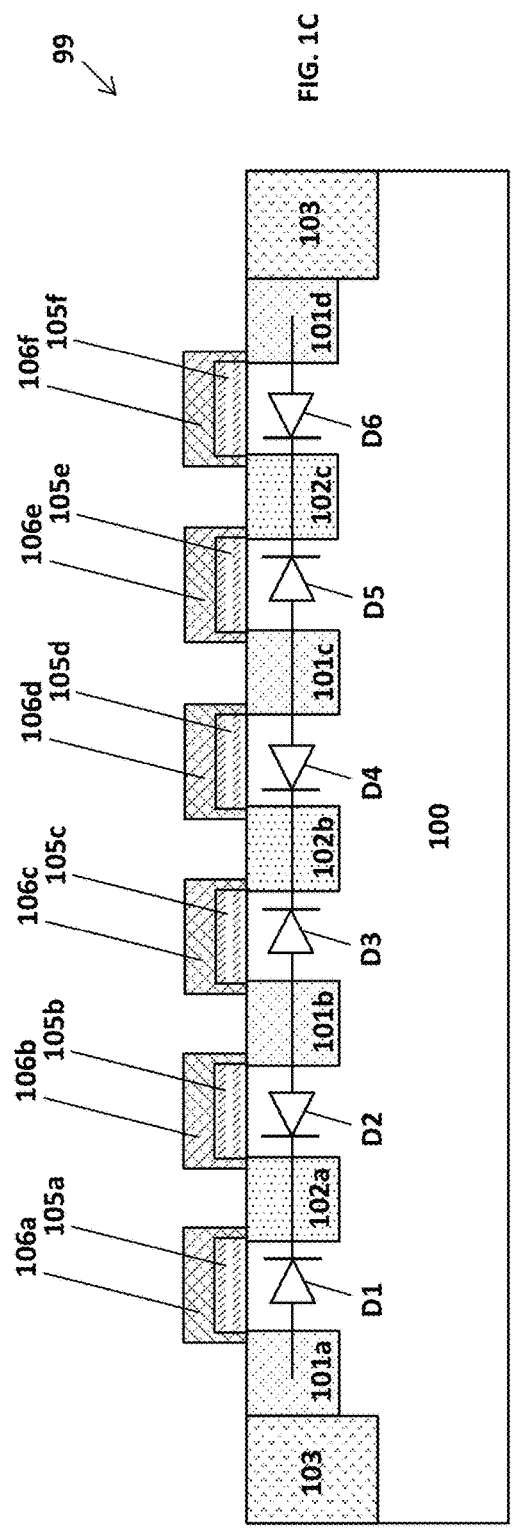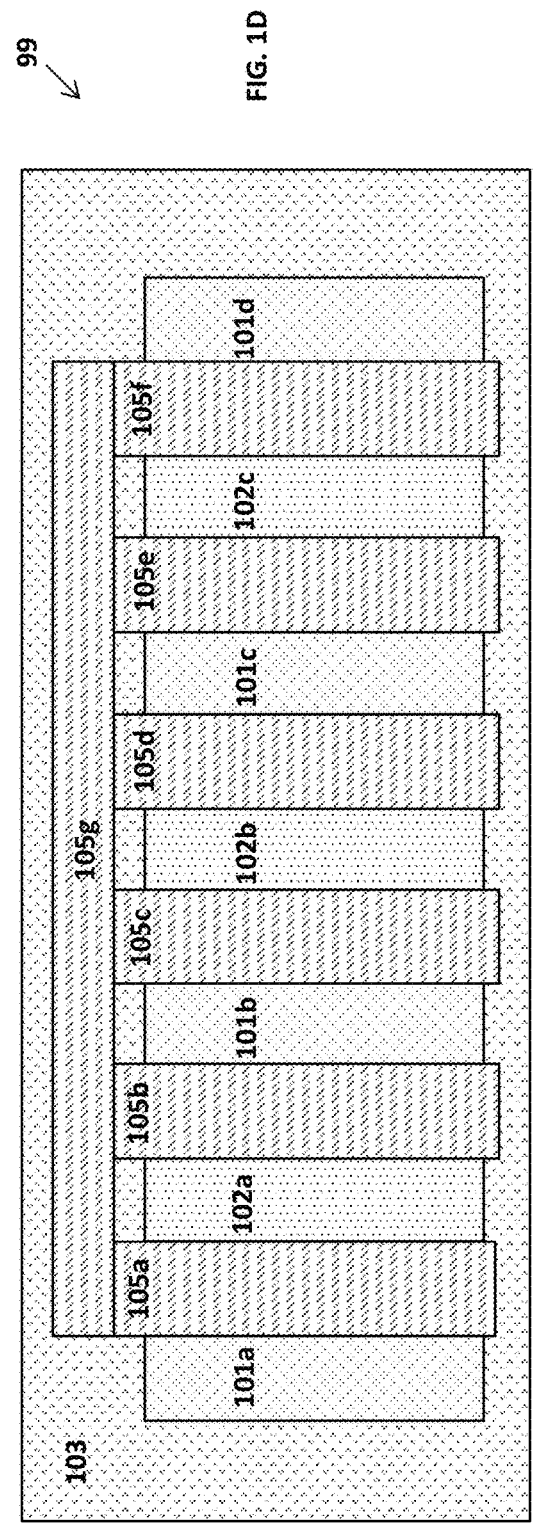

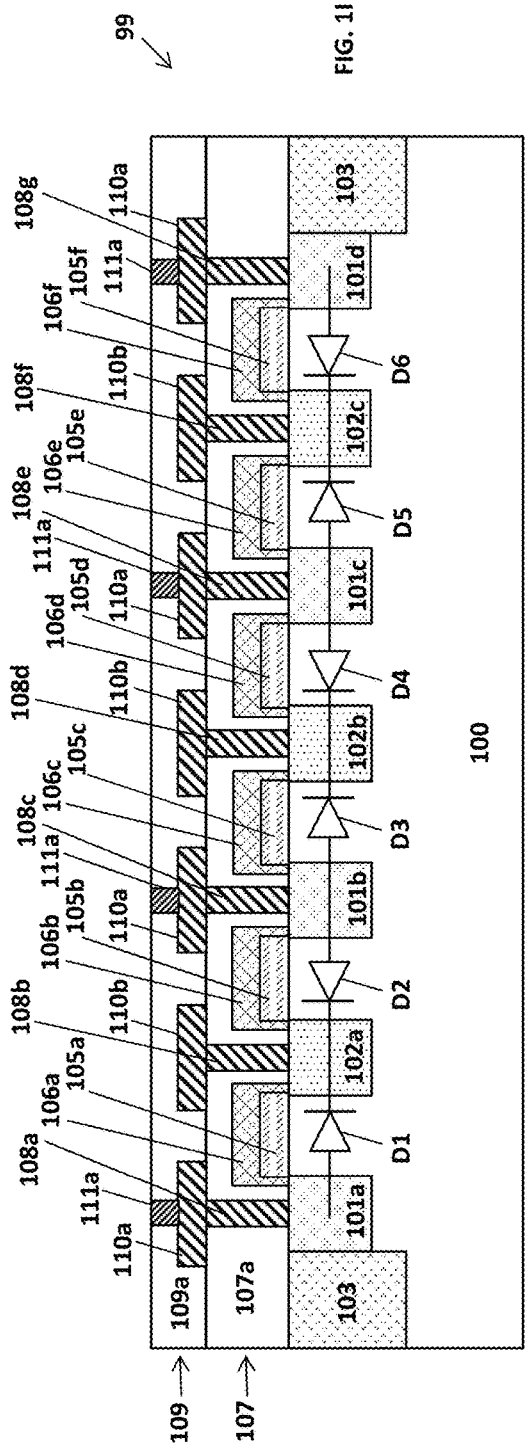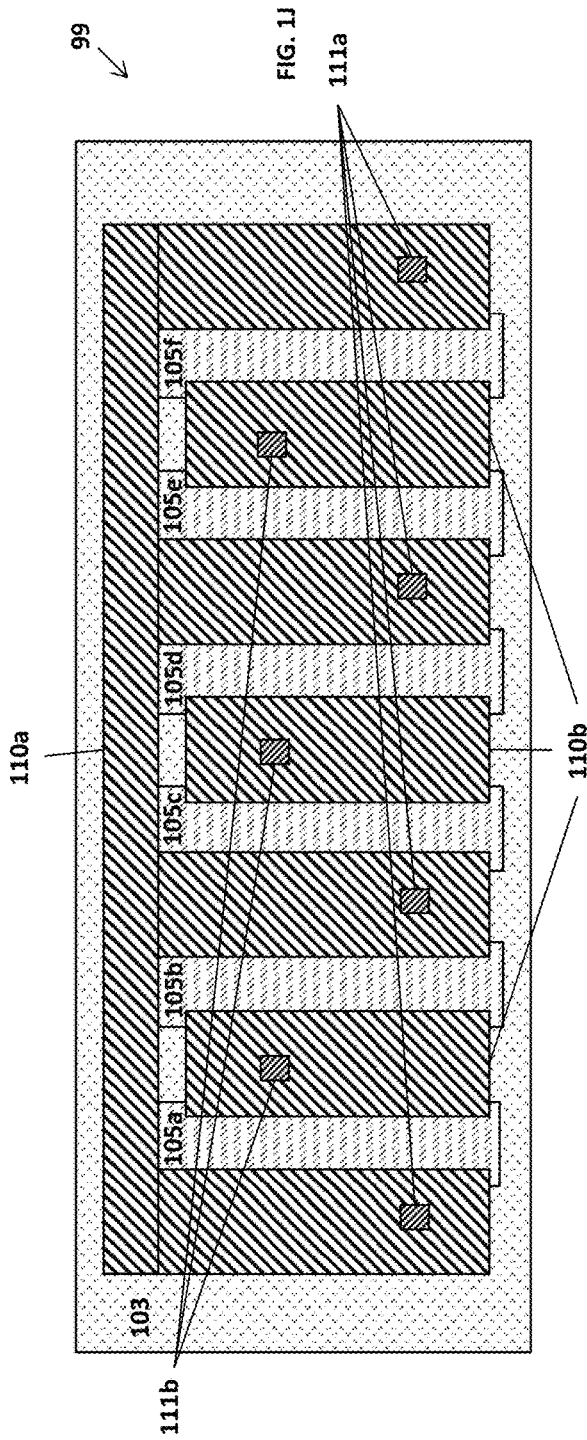

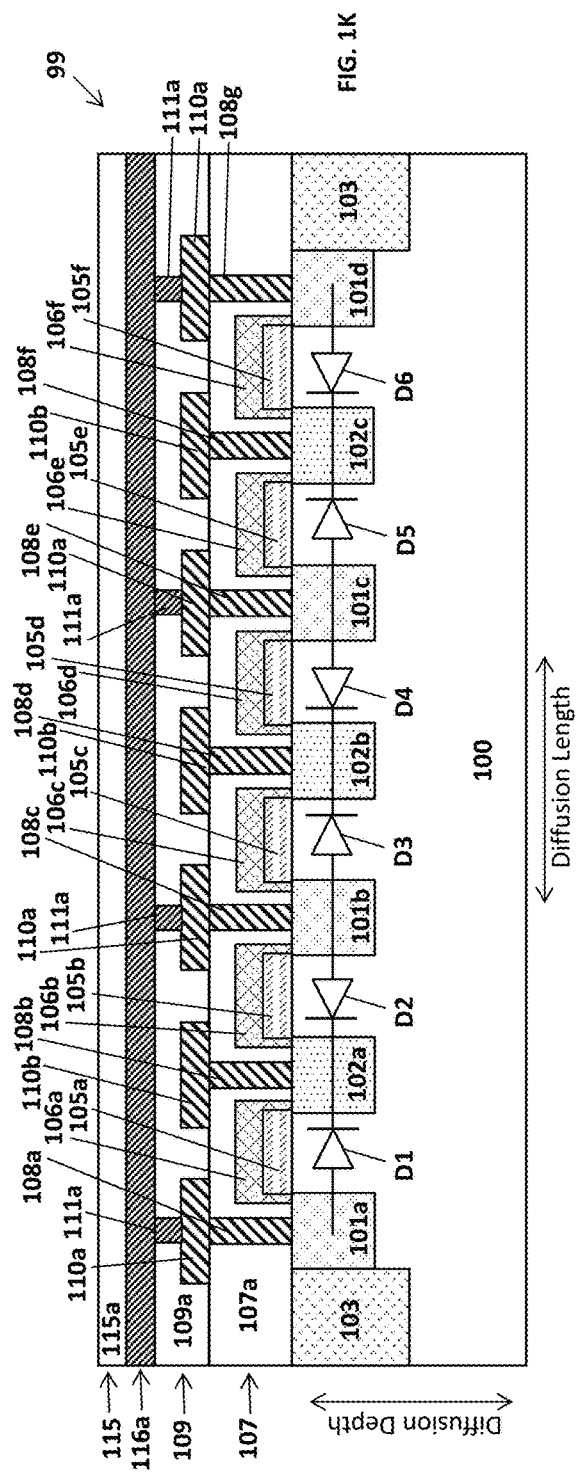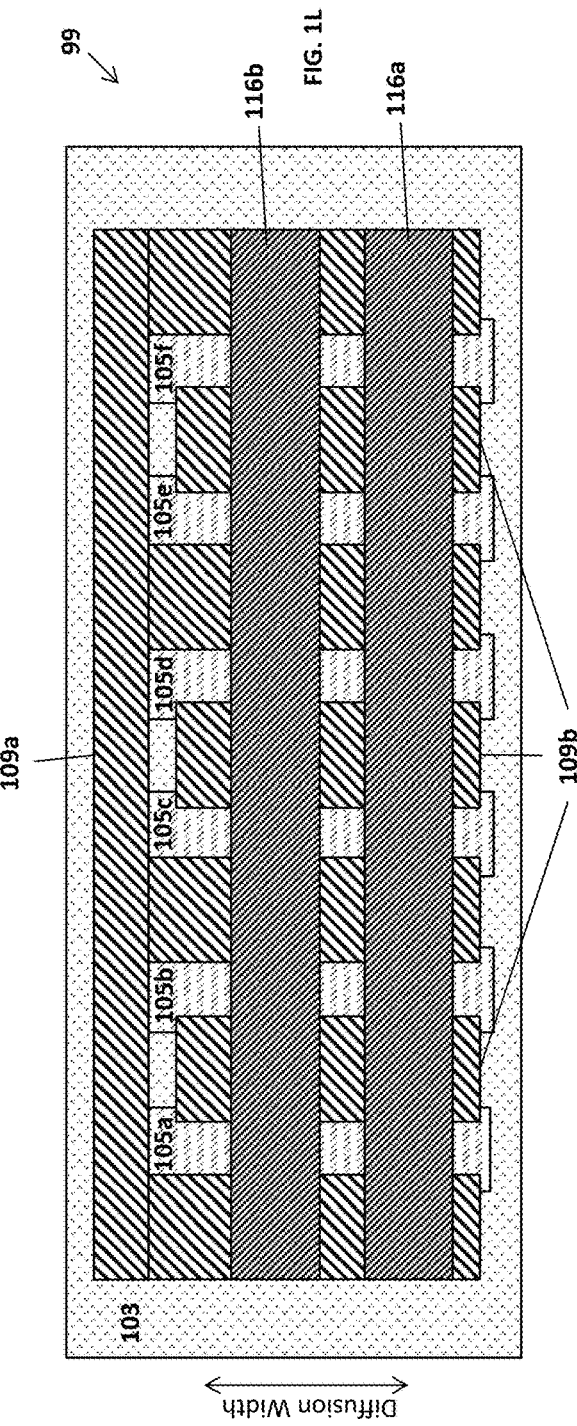

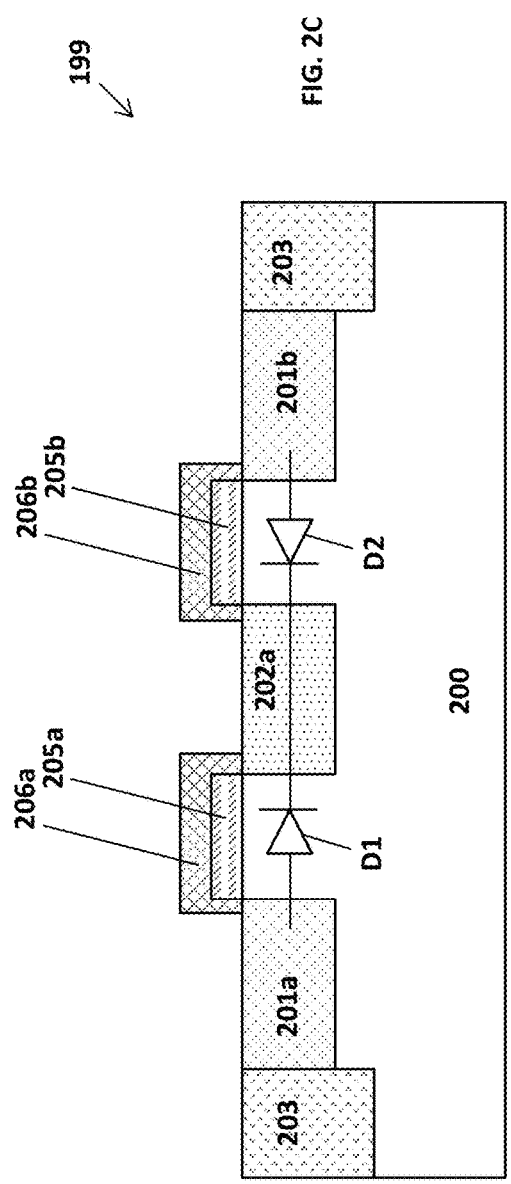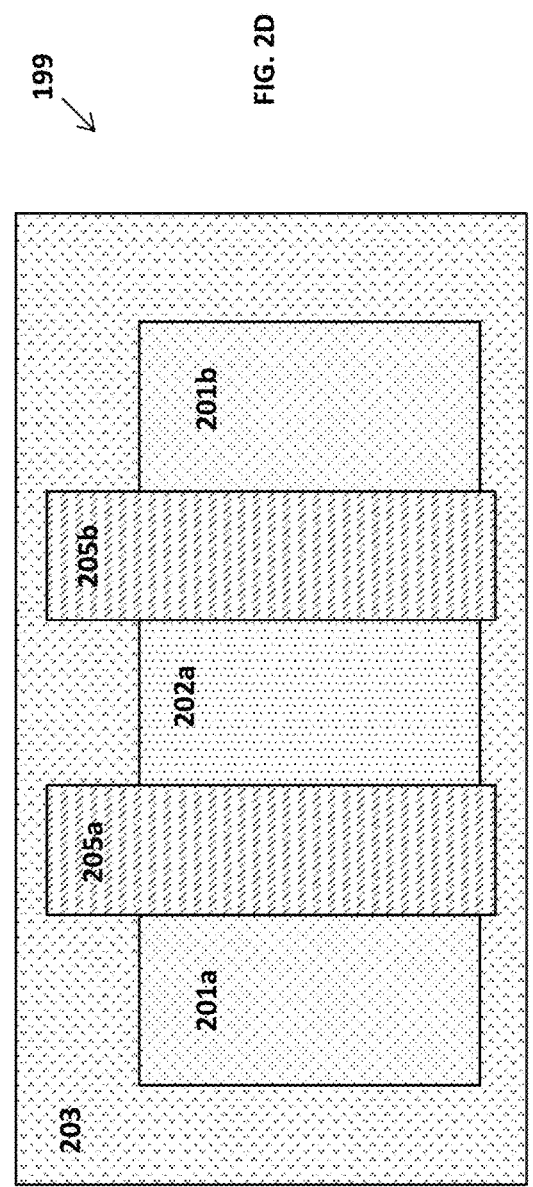

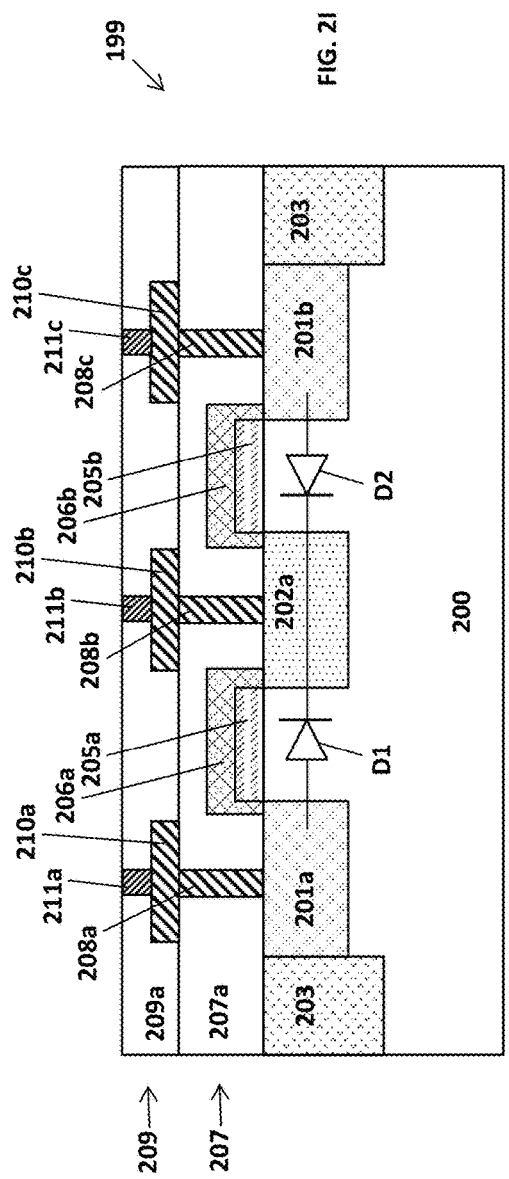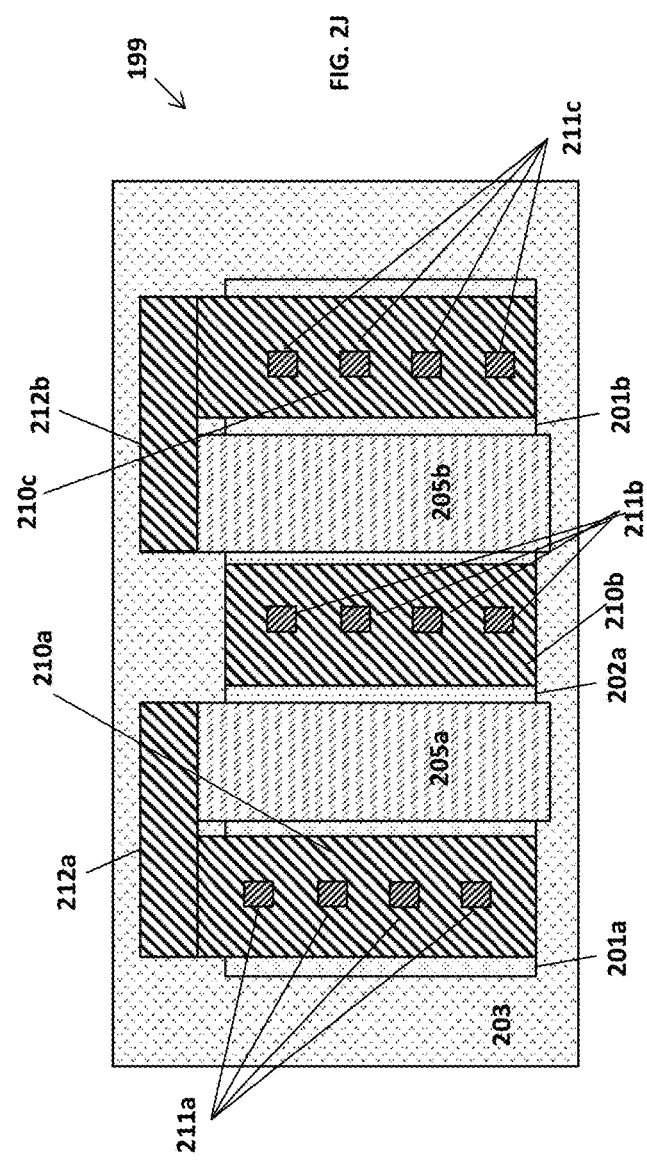

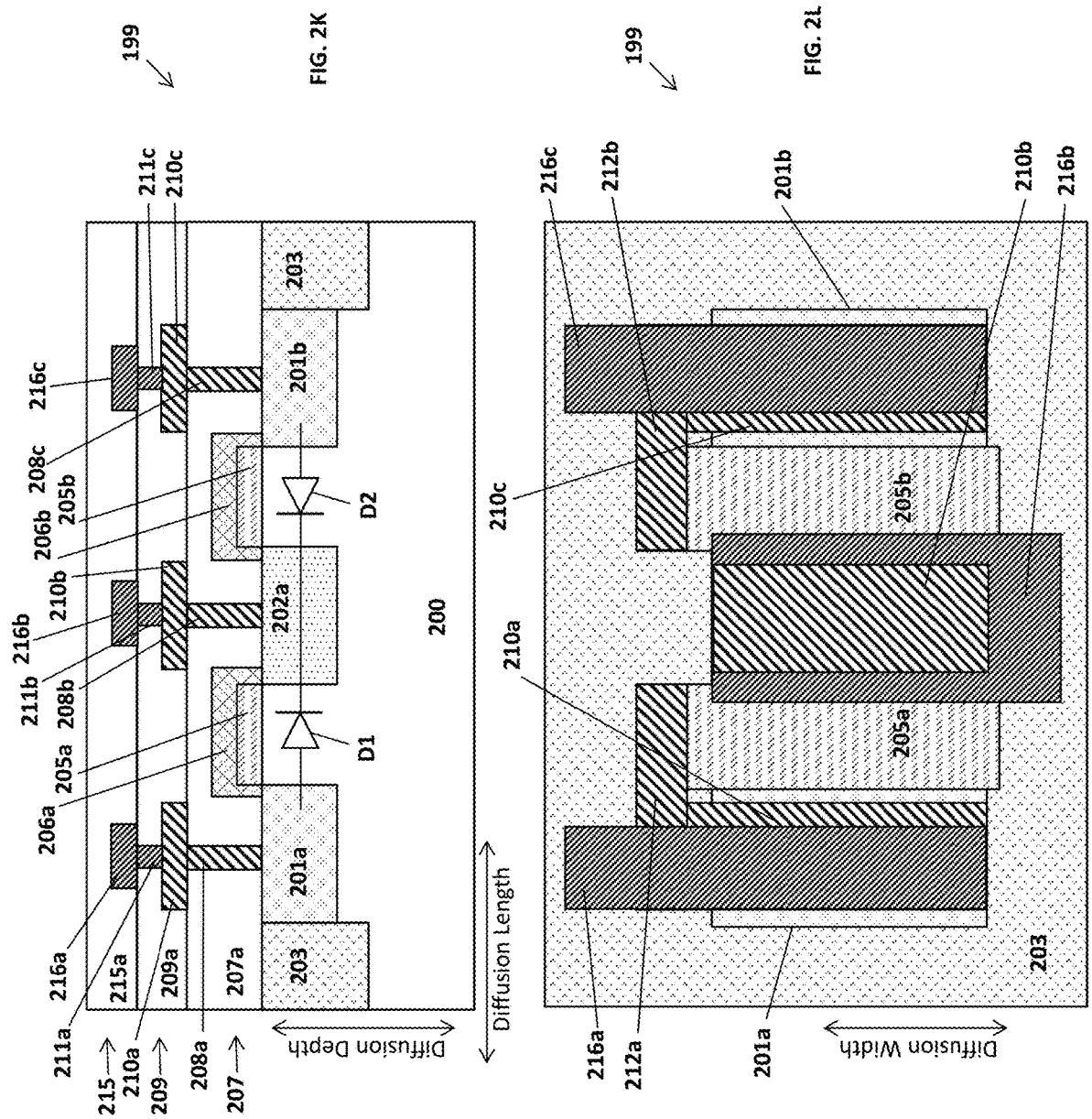

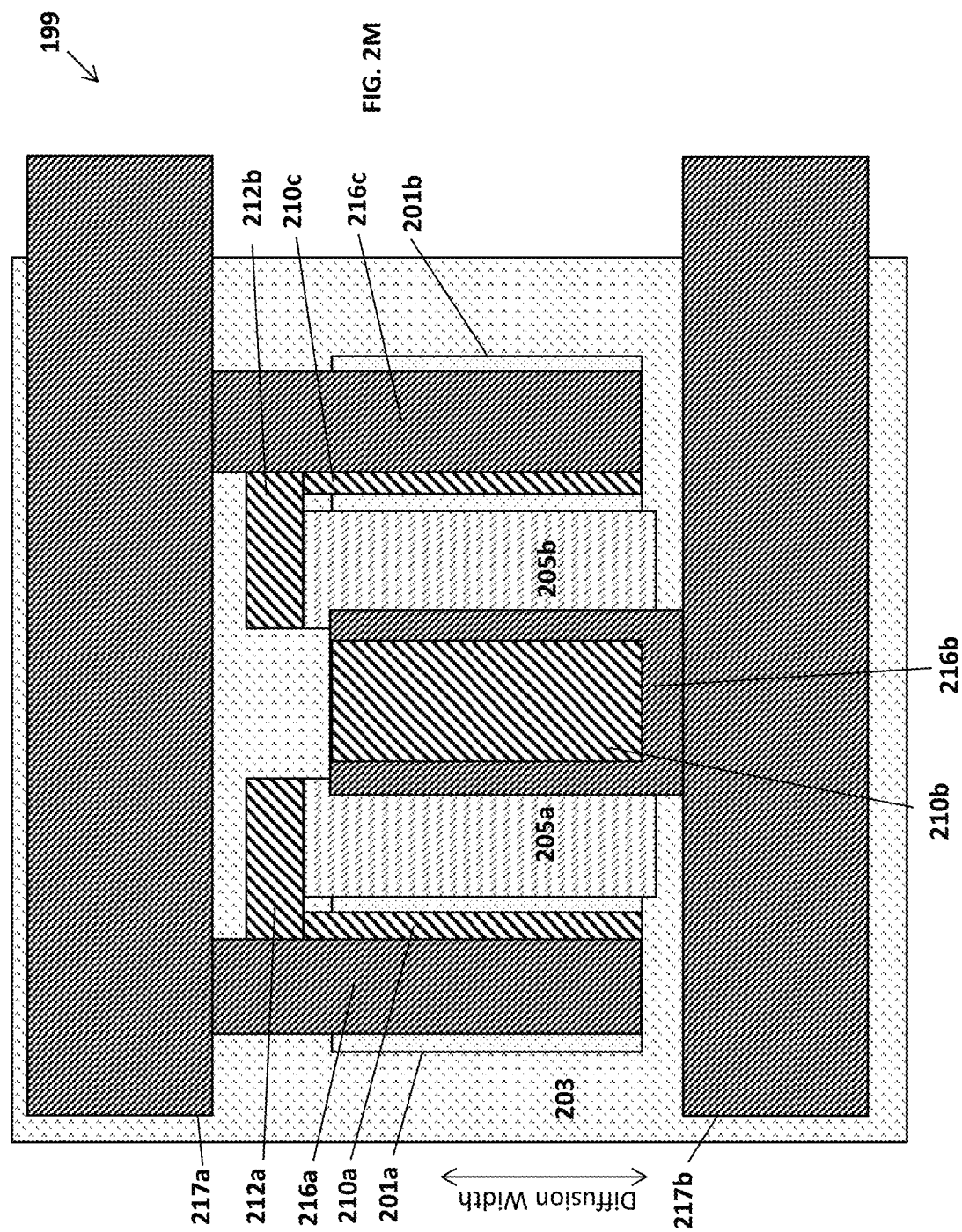

MULTI-FINGER DEVICES WITH REDUCED PARASITIC CAPACITANCE

RELATED APPLICATION

This application claims priority to United States application for Patent No. 62/868,091, filed Jun. 28, 2019, the contents of which are incorporated by reference to the maximum extent allowable under the law.

TECHNICAL FIELD

This application is directed to the field of integrated circuits and, in particular, to a multi-finger integrated circuit device containing, for example, diodes having reduced parasitic capacitances compared to prior designs.

BACKGROUND

In order to provide integrated circuits and the devices therein with sufficient protection against electrostatic discharges (ESD), large ESD protection devices are formed in those integrated circuits apart from the devices required to form circuitry used in the normal functionality of the integrated circuits. In addition to the large size of the ESD protection devices themselves, wide metal layers are used in their terminal connections to enable the requisite discharging of high currents.

However, miniaturization of integrated circuits and the devices formed therein is ever advancing. With miniaturization of integrated circuits, the parasitic capacitances of the active devices (such as MOSFETs (Metal Oxide Semiconductor Field Effect Transistors), diodes, etc.) in the integrated circuits have increased. Capacitance between the two parallel plate conductors with a dielectric material between them is given as $$C = \frac{\epsilon_r \epsilon_0 A}{d}$$

where, $\epsilon_r$ is the relative permittivity of the dielectric between the two conductors, $\epsilon_0$ is the permittivity of free space, A is the area of the cross-section of the conductors, and d is the spacing between the two conductors.

As can be appreciated from the above equation, with a decrease in the spacing between the conductors or an increase in the area of the cross-section of the conductor, the capacitance of the parallel plate capacitor increases.

Therefore, in case of MOSFETs or gated-diodes due to the reduction in the oxide thickness between the gate and substrate or body of the MOSFET or gated-diode, their parasitic capacitances have increased. Furthermore, with the reduction in the spacing between the source and drain terminals (biased at different potentials) of the MOSFETS or between the anode and cathode terminals of diodes (gated-diodes or Shallow Trench Isolation (STI) diodes), the spacing between the metals used to connect the respective terminals are also reduced. This reduction in the spacing between the metals biased at different potentials helps to further increase the capacitance associated with the devices.

In integrated circuits, different metal layers are added on top of each other with a dielectric material between them for making a connection among different devices to form a circuit. With miniaturization of the integrated circuits, the thickness of the dielectric material between different metal layers is also reduced which helps to further enhance the value of the parasitic capacitances between the metal layers.

Another result of miniaturization is the reduction in thickness of the metal layers of the integrated circuits which causes a reduction in the cross sectional area of the metal layers, meaning that the current carrying capacity of those metal layers has reduced. Hence wider metal conductors in the metal layers will be needed to carry the same current during an ESD event. This leads to an increase in the area of the overlap between the two different conductors and therefore an increase in the parasitic capacitance therebetween.

One of the aims of miniaturization in integrated circuit design is to enhance the speed of the devices in the integrated circuits. However, the addition of large ESD protection devices and wide metal layers for their connections at the pins of the integrated circuits that interact with the external world has (unwantedly) increased the parasitic capacitance at these pins. Since capacitance by virtue of its property limits the speed of its input signal, the parasitic capacitance associated with the large ESD devices limits the speed of the operation of integrated circuits and the devices therein.

The above two results of miniaturization therefore lead to a design quandary in terms of trade-off between ESD protection and speed. If the same ESD targets are to be supported despite the integrated circuits being formed using lower dimension-scale technologies, then the need for large size of ESD protection devices and the associated metal area needed for their connection would conventionally increase the parasitic capacitances associated with the external pins. This leads to the undesirable scenario of a designer being forced to choose between reducing ESD targets or reducing the operational speed of the integrated circuit.

To help avoid this trade-off, and to enable the fabrication of high speed devices without reduced ESD protection, further development is needed.

SUMMARY

Disclosed herein is an electronic device including a semiconductor substrate having an active area, first doped regions formed within the active area, and second doped regions within the active area. The first and second doped regions are separated from each other by portions of the semiconductor substrate. A plurality of gates are on the active area, each gate formed extending over a portion of the semiconductor substrate separating adjacent first and second doped regions, with a width of the plurality of gates being greater than a diffusion length of the first and second doped regions. A first metallization layer includes first electrical connectors between each of the first doped regions and a gate of the plurality of gates immediately adjacent to that first doped region, and second electrical connectors connected to each of the second doped regions. A second metallization layer includes a first electrical connector connected to each first electrical connector of the first metallization layer, and a second electrical connector connected to each second electrical connector of the first metallization layer, and the second electrical connector of the second metallization layer does not overlap the plurality of gates.

The diffusion length of the first and second doped regions may be greater than a diffusion length of other devices within the electronic device that have a same gate oxide thickness.

The second metallization layer may include a third electrical connector connected to each first electrical connector of the second metallization layer, and a fourth electrical connector connected to each second electrical connector of the second metallization layer, wherein the third and fourth electrical connectors of the second metallization layer do not overlap the plurality of gates and do not overlap the first metallization layer.

Also disclosed herein is an electronic device including a) a semiconductor substrate having an active area, b) first doped regions formed within the active area, c) second doped regions within the active area and spaced apart from adjacent ones of the first doped regions by portions of the active area, d) a plurality of gates on the active area, each gate extending over a portion of the semiconductor substrate separating adjacent first and second doped regions area, wherein a width of the plurality of gates is greater than a diffusion length of the first and second doped regions, e) a pre-metallization layer on the active area and plurality of gates, the pre-metallization layer including different respective contacts for the first and second doped regions and the plurality of gates, wherein the contacts for each of the plurality of gates are located on portions of those gates that do not overlap the first and second doped regions, f) a first metallization layer on the pre-metallization layer, the first metallization layer including first and second metal lines, the first metal lines of the first metallization layer each being electrically connected by the contacts to a different one of the first doped regions and to its adjacent one of the plurality of gates, the second metal lines of the first metallization layer each being electrically connected by the contacts to a different one of the second doped regions, and g) a second metallization layer on the first metallization layer. The second metallization layer includes first metal lines respectively connected to the first metal lines of the first metallization layer, and second metal lines respectively connected to the second metal lines of the first metallization layer, with the first metal lines of the second metallization layer extending beyond first portions of the first metallization layer in a first direction. The second metal lines of the second metallization layer extend beyond the second metal lines of the first metallization layer in a second direction opposite to the first direction such that the second metal lines of the second metallization layer do not overlap with the plurality of gates.

The second metallization layer may also include third metal lines respectively connected to the first metal lines of the second metallization layer at points of the first metal lines of the second metallization layer that extend beyond the first metal lines of the first metallization layer, and fourth metal lines respectively connected to the second metal lines of the second metallization layer at points of second portions of the second metallization layer that extend beyond the second portions of the first metallization layer.

In some instances, the third and fourth metal lines of the second metallization layer do not overlap the plurality of gates, while the third and fourth metal lines of the second metallization layer do not overlap the first metallization layer.

A shallow trench isolation may be formed in the semiconductor substrate and surrounding the active area.

The shallow trench isolation may divide the active area into a plurality of active areas, each of the plurality of active areas containing an instance of b), c), d), e), f), and g).

Also disclosed herein is an electronic device including a) a semiconductor substrate, b) a shallow trench isolation formed in the semiconductor substrate and surrounding an active area, c) a first number of regions doped with a first dopant type formed within the active area, d) a second number of regions doped with a second dopant type formed within the active area, wherein the regions with the second dopant type are positioned between and spaced apart from adjacent ones of the regions with the first dopant type, e) a plurality of gates on the active area, each gate formed between and slightly overlapping adjacent ones of the regions with the first dopant type and regions with the second dopant type, wherein a width of the plurality of gates is greater than a diffusion length of the regions with the first dopant type and the regions with the second dopant type, f) a pre-metallization layer on the active area and plurality of gates, the pre-metallization layer including different respective contacts for the regions with the first dopant type, regions with the second dopant type, and the plurality of gates, wherein the contacts for each of the plurality of gates are located on portions of those gates that do not overlap the regions with the first dopant type and regions with the second dopant type, g) a first metallization layer on the pre-metallization layer, the first metallization layer including first and second metal lines, the first metal lines of the first metallization layer each being electrically connected by the contacts to a different region with the first dopant type and to its adjacent one of the plurality of gates, the second metal lines of the first metallization layer each being electrically connected by the contacts to a different region with the second dopant type, each first metal line of the first metallization layer having a via extending upwardly therefrom, each second metal line of the first metallization layer having a via extending upwardly therefrom, and h) a second metallization layer on the first metallization layer. The second metallization layer includes first metal lines respectively connected to the first metal lines of the first metallization layer by the vias and second metal lines respectively connected to the second metal lines of the first metallization layer by the vias. The first metal lines of the second metallization layer extend beyond the first metal lines of the first metallization layer in a first direction, the second metal lines of the second metallization layer extend beyond the second metal lines of the first metallization layer in a second direction opposite to the first direction such that the second metal lines of the second metallization layer do not overlap with the gates.

The second metallization layer may also include third metal lines respectively connected to the first metal lines of the second metallization layer at points of the first metal lines of the second metallization layer that extend beyond the first metal lines of the first metallization layer, and fourth metal lines respectively connected to the second metal lines of the second metallization layer at points of the second metal lines of the second metallization layer that extend beyond the second metal lines of the first metallization layer.

The shallow trench isolation may divide the active area into a plurality of active areas, with each of the plurality of active areas containing an instance of b), c), d), e), f), g), and h).

Another aspect disclosed herein is directed to an improvement to an electronic device including a semiconductor substrate, a shallow trench isolation formed in the semiconductor substrate and surrounding an active area, a first number of regions doped with a first dopant type formed within the active area, a second number of regions doped with a second dopant type formed within the active area, wherein the regions with the second dopant type are positioned between and spaced apart from adjacent ones of the regions with the first dopant type. A plurality of gates are on the active area, and each gate formed between and slightly overlapping adjacent ones of the regions with the first dopant type and regions with the second dopant type. The improvement includes for a same total area consumed by the regions with the first dopant type and the regions with the second dopant type, and increasing diffusion length of the regions with the first dopant type and of the regions with the second dopant type, while decreasing a number of the regions with the first dopant type and of the regions with the second dopant type.

The electronic device may also include a pre-metallization layer on the active area and the plurality of gates, the pre-metallization layer including different respective contacts for the regions with the first dopant type, regions with the second dopant type, and the plurality of gates. A first metallization layer may be on the pre-metallization layer, the first metallization layer including first and second metal lines, the first metal lines of the first metallization layer each being electrically connected by the contacts to a different region with the first dopant type and to its adjacent one of the plurality of gates, the second metal lines of the first metallization layer each being electrically connected by the contacts to a different region with the second dopant type, each first metal line of the first metallization layer having a via extending upwardly therefrom, each second metal line of the first metallization layer having a via extending upwardly therefrom. A second metallization layer may be on the first metallization layer and include first metal lines respectively connected to the first metal lines of the first metallization layer by the vias and second metal lines respectively connected to the second metal lines of the first metallization layer by the vias. The improvement may also include the contacts for each of the plurality of gates being located on portions of those gates that do not overlap the regions with the first dopant type and regions with the second dopant type.

The improvement may also include the first metal lines of the second metallization layer extending beyond the first metal lines of the first metallization layer in a first direction, and the second metal lines of the second metallization layer extending beyond the second metal lines of the first metallization layer in a second direction opposite to the first direction such that the second metal lines of the second metallization layer do not overlap with the gates.

The improvement may also include the second metallization layer having third metal lines respectively connected to the first metal lines of the second metallization layer at points of the first metal lines of the second metallization layer that extend beyond the first metal lines of the first metallization layer, and fourth metal lines respectively connected to the second metal lines of the second metallization layer at points of the second metal lines of the second metallization layer that extend beyond the second metal lines of the first metallization layer.

The improvement may also include the third metal lines of the second metallization layer not overlapping the first metallization layer and not overlapping the plurality of gates, and the fourth metal lines of the second metallization layer not overlapping the first metallization layer and not overlapping the plurality of gates.

Also disclosed herein is an electronic device including a semiconductor substrate, first doped regions formed within the semiconductor substrate, second doped regions within the semiconductor substrate, and a plurality of gates on the active area, each gate formed over a portion of the semiconductor substrate between adjacent first and second doped regions. The electronic device includes a first metallization layer with first electrical connectors between each of the first doped regions and a gate of the plurality of gates, and second electrical connectors connected to each of the second doped regions. The electronic device also includes a second metallization layer with a first electrical connector connected to each first electrical connector of the first metallization layer, and a second electrical connector connected to each second electrical connector of the first metallization layer, wherein the second electrical connector of the second metallization layer does not overlap the plurality of gates A diffusion length of the first and second doped regions is greater than a diffusion length of other devices within the electronic device that have a same gate oxide thickness.

The second metallization layer also includes a third electrical connector connected to each first electrical connector of the second metallization layer, and a fourth electrical connector connected to each second electrical connector of the second metallization layer.

In some instances, the third and fourth electrical connectors of the second metallization layer do not overlap the plurality of gates and do not overlap the first metallization layer.

Also disclosed herein is an electronic device including a semiconductor substrate, first doped regions formed within the semiconductor substrate, second doped regions within the semiconductor substrate, a plurality of gates on the semiconductor substrate, and a pre-metallization layer on the active area and plurality of gates, the pre-metallization layer including different respective contacts for the first and second doped regions and the plurality of gates. The electronic device also includes a first metallization layer on the pre-metallization layer, the first metallization layer including first and second metal lines, the first metal lines of the first metallization layer each being electrically connected by the contacts to a different one of the first doped regions and to its one of the plurality of gates, the second metal lines of the first metallization layer each being electrically connected by the contacts to a different one of the second doped regions. The electronic device further includes a second metallization layer on the first metallization layer and including first metal lines respectively connected to the first metal lines of the first metallization layer, and second metal lines respectively connected to the second metal lines of the first metallization layer. The first metal lines of the second metallization layer extend beyond first portions of the first metallization layer in a first direction, and the second metal lines of the second metallization layer extend beyond the second metal lines of the first metallization layer in a second direction opposite to the first direction such that the second metal lines of the second metallization layer do not overlap with the plurality of gates.

The second metallization layer may also include third metal lines respectively connected to the first metal lines of the second metallization layer, and fourth metal lines respectively connected to the second metal lines of the second metallization layer.

In some instances, the third and fourth metal lines of the second metallization layer do not overlap the plurality of gates, and the third and fourth metal lines of the second metallization layer do not overlap the first metallization layer.

A diffusion length of the first and second doped regions may be greater than a diffusion length of other devices within the electronic device that have a same gate oxide thickness.

Further disclosed herein is an improvement to an electronic device including a semiconductor substrate, a shallow trench isolation formed in the semiconductor substrate, a first number of regions doped with a first dopant type formed within an area surrounded by the shallow trench isolation, and a second number of regions doped with a second dopant type formed within the area surrounded by the shallow trench isolation. The regions doped with the second dopant type are positioned between and spaced apart from adjacent ones of the regions with the first dopant type. A plurality of gates are on the area surrounded by the shallow trench isolation, with each gate formed between and slightly overlapping adjacent ones of the regions doped with the first dopant type and regions with the second dopant type. The improvement is that for a same total area consumed by the regions doped with the first dopant type and the regions doped with the second dopant type, the diffusion length of the regions doped with the first dopant type and of the regions doped with the second dopant type is increased.

The electronic device may also include a pre-metallization layer on the area surrounded by the shallow trench isolation and the plurality of gates, the pre-metallization layer including different respective contacts for the regions doped with the first dopant type, regions doped with the second dopant type, and the plurality of gates. The electronic device may also include a first metallization layer on the pre-metallization layer, the first metallization layer including first and second metal lines, the first metal lines of the first metallization layer each being electrically connected by the contacts to a different region doped with the first dopant type and to its adjacent one of the plurality of gates, the second metal lines of the first metallization layer each being electrically connected by the contacts to a different region doped with the second dopant type. The electronic device may also include a second metallization layer on the first metallization layer and comprising first metal lines respectively connected to the first metal lines of the first metallization layer and second metal lines respectively connected to the second metal lines of the first metallization layer. In this instance, the improve may also include locating the contacts for each of the plurality of gates being on portions of those gates that do not overlap the regions doped with the first dopant type and regions doped with the second dopant type.

The improvement may also be that the first metal lines of the second metallization layer extend beyond the first metal lines of the first metallization layer in a first direction, and that the second metal lines of the second metallization layer extend beyond the second metal lines of the first metallization layer in a second direction opposite to the first direction.

The improvement may also be that the second metallization layer has third metal lines respectively connected to the first metal lines of the second metallization layer at points of the first metal lines of the second metallization layer that extend beyond the first metal lines of the first metallization layer.

The improvement may also be that the third metal lines of the second metallization layer do not overlap the first metallization layer and not overlapping the plurality of gates.

BRIEF DESCRIPTION OF THE DRAWINGS

FIGS. 1A, 1C, 1E, 1G, 1I, and 1K show cross sectional views of a multi-fingered diode device within an integrated circuit, with each successive figure showing successive steps in a device fabrication process.

FIGS. 1B, 1D, 1F, 1H, 1J, and 1L show respective top plan views of the multi-fingered diode devices FIGS. 1A, 1C, 1E, 1G, 1I, and 1K.

FIGS. 2A, 2C, 2E, 2G, 2I, and 2K show cross sectional views of an improved multi-fingered diode device within an integrated circuit, with each successive figure showing successive steps in a device fabrication process.

FIGS. 2B, 2D, 2F, 2H, 2J, and 2L show respective top plan views of the improved multi-fingered diode devices of FIGS. 2A, 2C, 2E, 2G, 2I, and 2K.

FIG. 2M shows a top plan view of the improved multi-fingered diode device of FIG. 2K with additional connections in its top metal layer.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1E:
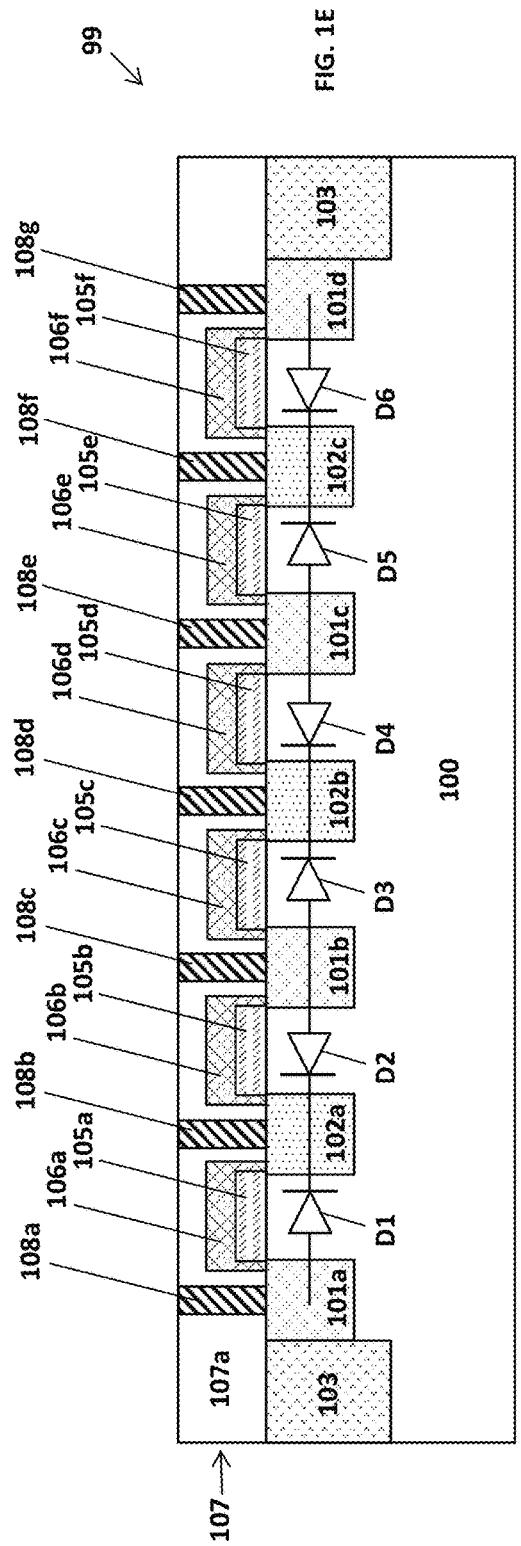

A first multi-fingered gated-diode (with N+ doped region in a P-doped substrate) device 99 and its process for fabrication is now described with reference to FIGS. 1A-1L. Referring initially to FIGS. 1A-1B, a shallow trench isolation 103 is formed in a lightly P-doped semiconductor substrate 100, and the active region is defined and surrounded by the shallow trench isolation. Then, patterning and dopant implantation is performed to form the P+ doped (heavily P doped) regions 101a-101d, and to form the N+ doped (heavily N doped) regions 102a-102c between adjacent ones of the P+ doped regions 101a-101d. The spacing between the P+ regions 101a-101d and N+ regions 102a-102c (and thus the channel length) may be, for example, be D μm.

Referring now to FIGS. 1C-1D, gate dielectric layers (not explicitly shown due to their very thin size) are deposited on the substrate 100 between and slightly overlapping respective adjacent P+ regions 101a-101d and N+ regions 102a-102c. Gates 105a-105g are then formed on the gate dielectric layers (and therefore also slightly overlapping the P+ regions 101a-101d and N+ regions 102a-102c), and insulating caps 106a-106f are formed to surround the gates 105a-105g. This may, for example, be performed by depositing a polysilicon layer on the gate dielectric layers, and then lithography is used to pattern the gates 105a-105g. Therefore, at this point, the active areas of gated-diodes D1-D6 have been formed between the N+ regions 102a-102c (as cathodes) and surrounding P-doped semiconductor substrate 100 (as anodes), with the P+ regions 101a-101d forming the anode contacts and the N+ regions 102a-102c forming the cathode contacts. Note that, as shown in FIG. 1D, all gates 105a-105g are common and electrically connected to one another at 105g (the insulating caps 106a-106f have not been shown in FIG. 1D so that this common gate structure can be seen) to form a gate comb structure, with the P+ regions 101a-101d and N+ regions 102a-102c interdigitated with the gate comb structure.

Figure 1F:
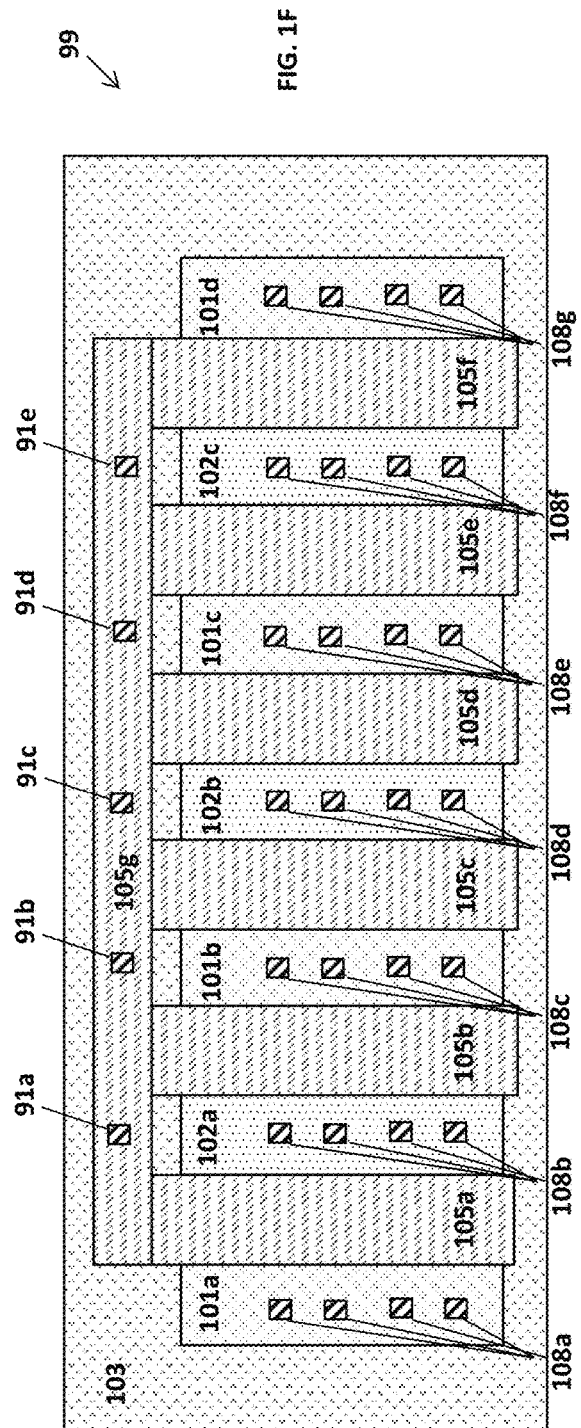

Referring now to FIGS. 1E-1F, a pre-metallization dielectric layer 107 containing P+ region contacts or vias 108a, 108c, 108e, 108g for the respective P+ regions 101a-101d, containing N+ region contacts or vias 108b, 108d, 108f for respective N+ regions 102a-102c, and containing gate contacts 91a-91e (not shown in the FIG. 1E cross section) for the common gates 105a-105g is formed. This may, for example, be performed by depositing a dielectric layer 107a (not shown in the FIG. 1F top plan view), and then the top surface of the dielectric layer 107a is planarized. Then, openings are formed which extend through the dielectric layer 107a, and these openings are filled with metal, such as tungsten, to form the contacts 108a-108g and 91a-91e. Note that the upper surfaces of the P+ regions 101a-101d and the N+ regions 102a-101c may have a silicide layer thereon improving the electrical connection between those regions and the contacts 108a-108g.

Figure 1G:
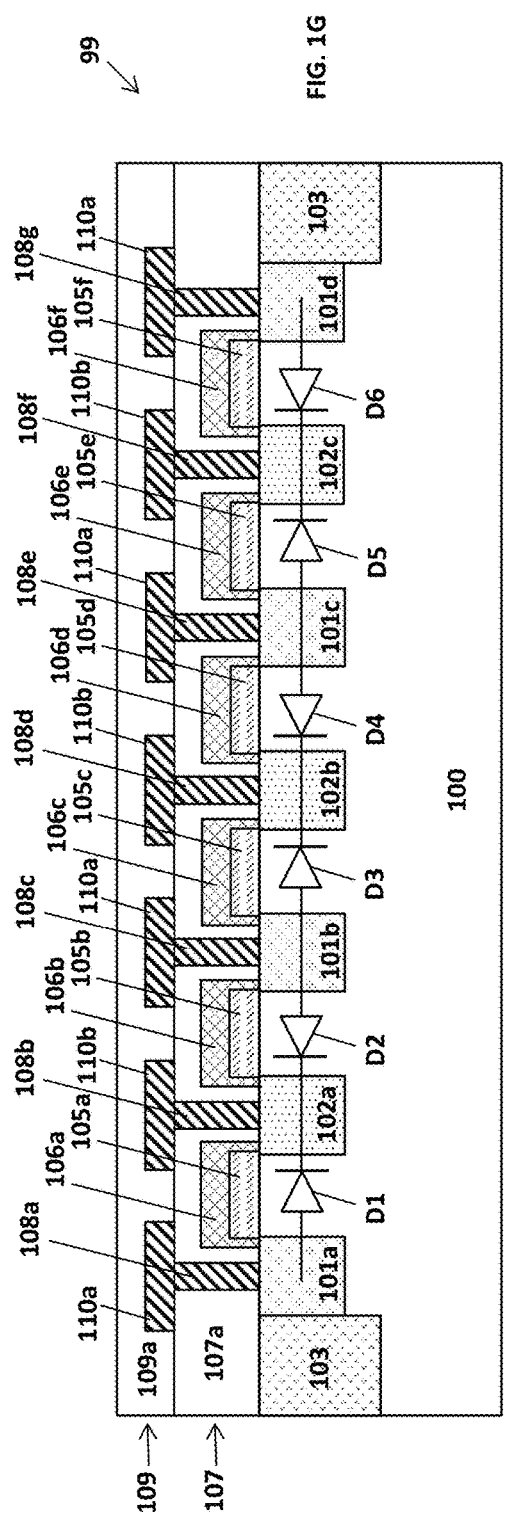
Figure 1H:
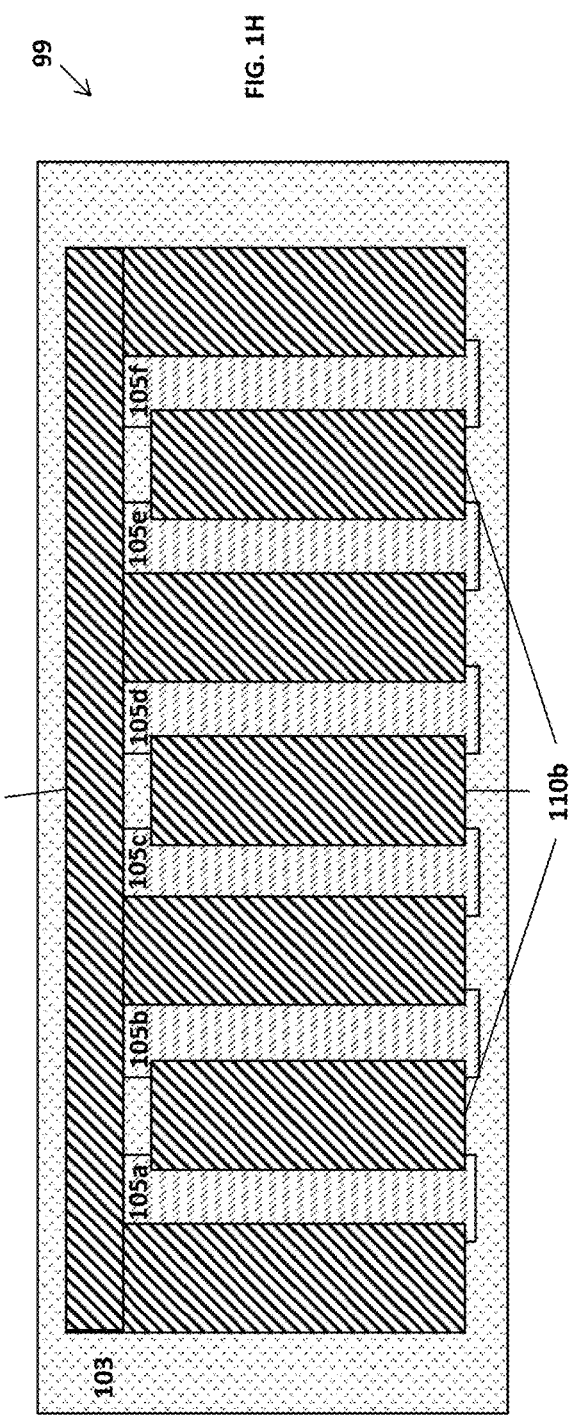

Referring now to FIGS. 1G-1H, the first metallization layer 109 is formed on the pre-metallization dielectric layer 107. As seen in FIG. 1H, the first metallization layer 109 includes first metal lines 110a formed in its dielectric 109a (not shown in FIG. 1H, but shown in FIG. 1G) and arranged into a comb structure common and connected to P+ regions 101a-101d and gates 105a-105g by the contacts 108a, 108c, 108e, 108g, and 91a-91e, and second metal lines 110b formed in its dielectric 109a and interdigitated with the comb structure and common and connected to the N+ regions 102a-102c by the contacts 108b, 108d, 108f. The spacing between the fingers of the comb structure 110a and interdigitated fingers 110b may be $Dm_1$ μm, which is smaller than D μm. This first metallization layer 109 may be formed by, for example, depositing the metal lines 110a, 110b (such as copper or aluminum) on the dielectric layer 107a, and then depositing the dielectric layer 109a over the metal lines 110a, 110b.

Referring now to FIGS. 1I-1J, as can best be seen in FIG. 1J, the first metallization layer 109 includes vias 111a formed in its dielectric and extending upward from and connected to the comb structure 110a (and thus the P+ regions 101a-101d), and vias 111b (not shown in the cross section of FIG. 1J) formed in its dielectric and extending upward from and connected to the metal lines 110b interdigitated with the comb structure (and thus the N+ regions 102a-102c). The vias 111a and 111b may be formed by, for example, by planarizing the top surface of the dielectric layer 109a. Then, openings are formed which extend through the dielectric layer 109a, and these openings are filled with metal, such as copper or aluminum, to form the vias 111a, 111b.

Referring now to FIGS. 1K-1L, the second metallization layer 115 is formed on the first metallization layer 109. The second metallization layer 115 includes first metal line 116a formed in its dielectric and connected to the vias 111a of the first metallization layer 109 (and thus the P+ regions 101a-101d), and a second metal line 116b formed in its dielectric and connected to the vias 111b (not shown in FIG. 1K) of the first metallization layer (and thus the N+ regions 102a-102c). The second metallization layer 115 is formed by depositing the metal lines 116a, 116b on the top surface of the dielectric 109a, and then depositing the dielectric layer 115a (not shown in FIG. 1L) on top of the dielectric 109a and metal lines 116a, 116b.

Therefore, the multi-fingered diode device 99 as shown in FIGS. 1K-1L is fully formed and complete with diodes D1-D6. The diffusion depth of the multi-fingered diode device 99 is along the Y-direction of FIG. 1K, the diffusion length of the multi-fingered diode device 99 is along the X-direction of FIG. 1K, and the diffusion width of the multi-fingered diode device 99 is along the Y-direction of FIG. 1L.

As explained above, parasitic capacitances within the multi-fingered diode device 99 are of concern. First parasitic capacitances ($C_a1$) are formed between the bottom of the N+ regions 102a-102c and the p-type substrate 100 where they contact the substrate 100 along the diffusion width and diffusion length. Second parasitic capacitances ($C_a2$) are formed between the side of the N+ regions 102a-102c and the p-type substrate 100 where they contact the substrate 100 along the diffusion width and diffusion depth. Third parasitic capacitances ($C_a3$) are formed by the overlap between the gates 105a-105f and the N+ regions 102a-102c. Therefore, noting the extension of the N+ regions 102a-102c along the diffusion width it should be noticed that the parasitic capacitances (first, second, and third) within the multi-fingered diode device 99 that do not result from the metallization layers are largely a function of the perimeter of the N+ regions 102a-102c.

As also explained above, parasitic capacitances within the multi-fingered device 99 resulting from the first metal layer 109 and second metal layer 115 are of concern. Here, the overlap capacitances between the metal lines 116a, 116b of the second metal layer 115 and the metal lines 110b, 110a of the first metal layer 109 are large due to the large overlap regions between the metal lines 116a and 110b and similarly between the metal lines 116b and 110a. In addition, there is a large fringing capacitance between the metal layers 110a and 110b of first metal layer 109 and between the metal layers 116a and 116b of second metal layer 115 due to the small spacing between the respective metal lines at same metal level.

It should be noted that the structure of the multi-fingered gated-diode (N+ doped region in the P-doped substrate) device 99 shown was shown with only four P+ regions 101a-101d and three N+ regions 102a-102c for example purposes and to keep the drawing figure legible. Actual implementations may include repeated tiling of the P+ regions 101a-101d, N+ regions 102a-102c, and other associated layers and circuitry, so that they may feature any number of P+ regions, and a number of N+ regions equal to one less than the number of P+ regions. Actual implementations may also include any additional number of metal layers for making desired connections to other components. Similarly, a gated-diode (P+ doped region in an n-well) device can be implemented on the same principle by swapping the P+ diffusions and N+ diffusions in the N-doped substrate (or n-well) instead in a P-doped substrate.

While the multi-fingered device 99 has diodes D1-D6 suitable for many purposes and is an exemplary device, reductions in parasitic capacitances can be made with further design improvements.

Figure 2A:
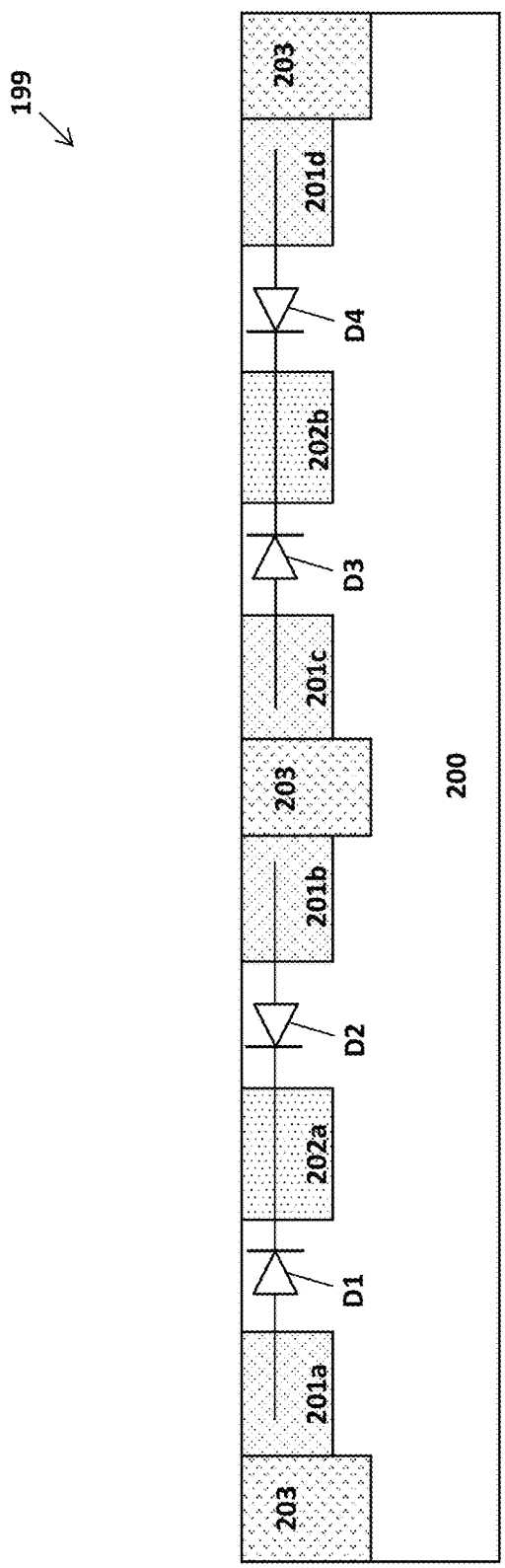
Figure 2B:
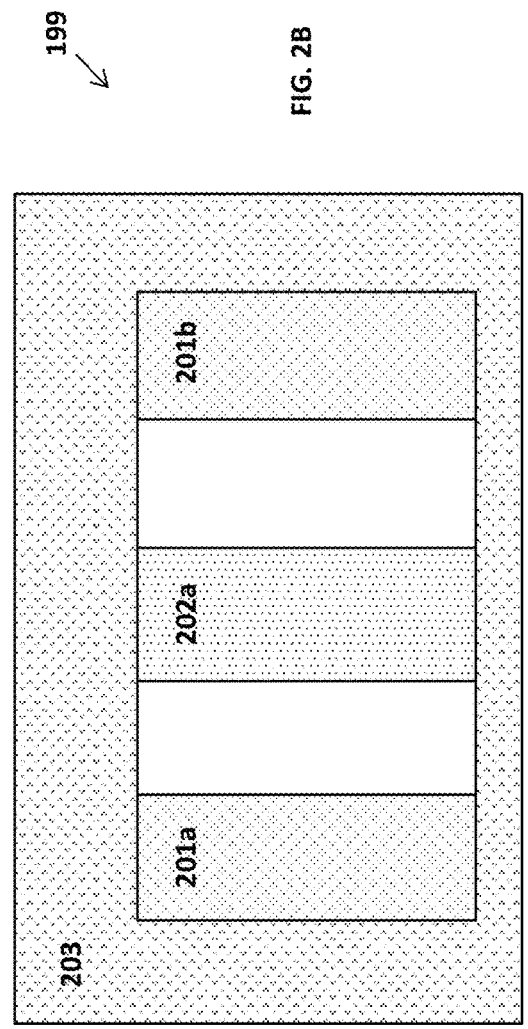

A second and improved multi-fingered gated-diode (N+ doped region in a P-doped substrate) device 199 and its fabrication is now described with reference to FIGS. 2A-2M. Referring initially to FIGS. 2A-2B, a shallow trench isolation 203 is formed in a lightly P-doped semiconductor substrate 200, and each active region is defined and surrounded by the shallow trench isolation 203. Then, patterning and implantation is performed to form the P+ doped (heavily P doped) regions 201a-201b, and to form the N+ doped (heavily N doped) region 202a there-between. The spacing between the P+ regions 201a-201d and N+ region 202a-202b (and thus the channel length) may be, D μm (the same value D as was in the multi-fingered gated-diode 99). Note that, as shown in FIG. 2A, there may be a portion of the shallow trench isolation 203 insulating P+ region 201b from P+ region 201c, allowing a tiling of the P+/N+/P+ order of the structure. Thus, also shown in FIG. 2A are P+ doped (heavily P doped) regions 201c-201d with an N+ doped (heavily N doped) region 202b there-between. Note that for brevity and ease of explanation, the tiled portions (P+ regions 201c-201d and N+ region 202b) are not shown in FIG. 2B, or in the remainder of the description and drawings of the improved multi-fingered diode device 199. However, real devices may include any number of such additional tiled portions.

Referring now to FIGS. 2C-2D, gate dielectrics (not explicitly shown due to their very thin size) are deposited on the P-doped semiconductor substrate 200 between and slightly overlapping respective adjacent P+ regions 201a-201b and N+ region 202a. Gates 205a-205b are then formed on the gate dielectrics (and therefore also slightly overlapping the P+ regions 201a-201b and N+ region 202a), and insulating caps 206a-206b are formed to surround the gates 205a-205b. This may, for example, be performed by depositing a polysilicon layer on the gate dielectric layers, and then lithography is used to pattern the gates 205a-205b. Therefore, at this point, the active areas of diodes D1-D2 have been formed between the N+ regions 202a (as cathodes) and the surrounding P-doped semiconductor substrate (as anodes), with the P+ regions 201a, 201b forming the anode contacts and the N+ region 202a forming the cathode contact. Note that, as shown in FIG. 2D, the gates 205a-205b are not common and not electrically connected to one another (the insulating caps 206a-206b have not been shown in FIG. 2D for ease of viewing).

Figure 2E:
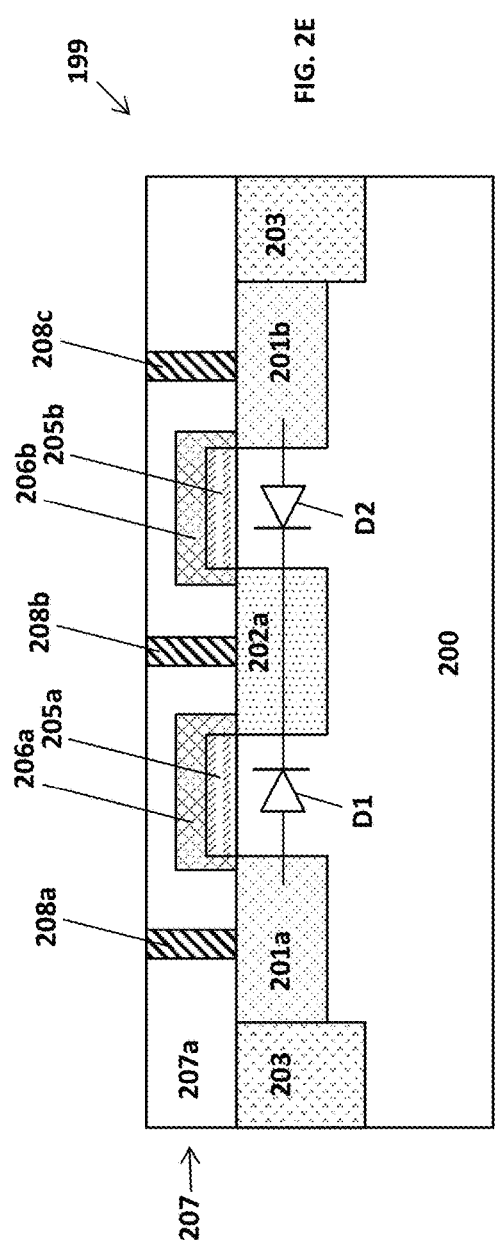
Figure 2F:
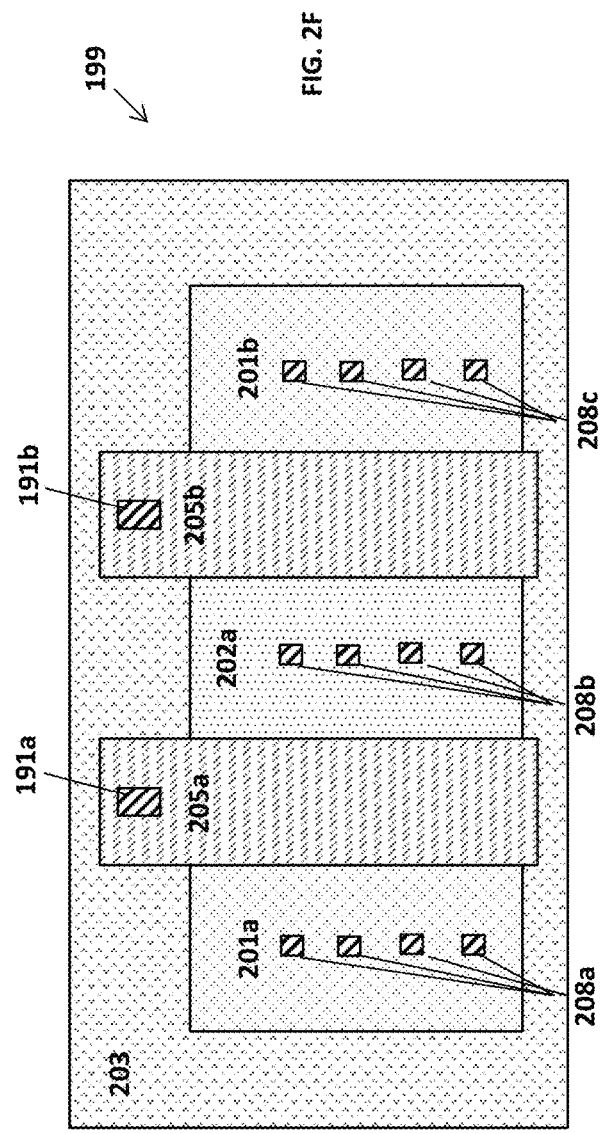

Referring now to FIGS. 2E-2F, a pre-metallization dielectric layer 207 containing P+ region contacts 208a, 208c for respective P+ regions 201a-201b, containing N+ region contact 208b for the N+ region 202a, and containing gate contacts 191a-191b for the gates 205a-205b is formed. This may, for example, be performed by depositing a pre-metallization dielectric layer 207a (not shown in the FIG. 2F top plan view), and then the top surface of the pre-metallization dielectric layer 207a is planarized. Then, openings are formed which extend through the pre-metallization dielectric layer 207a, and these openings are filled with metal, such as tungsten, to form the contacts 208a-208c, 191a-191b. Note that the upper surfaces of the P+ regions 201a-201b and N+ region 202a may have a silicide layer thereon improving the electrical connection between those regions and the contacts 208a-208c.

Figure 2G:
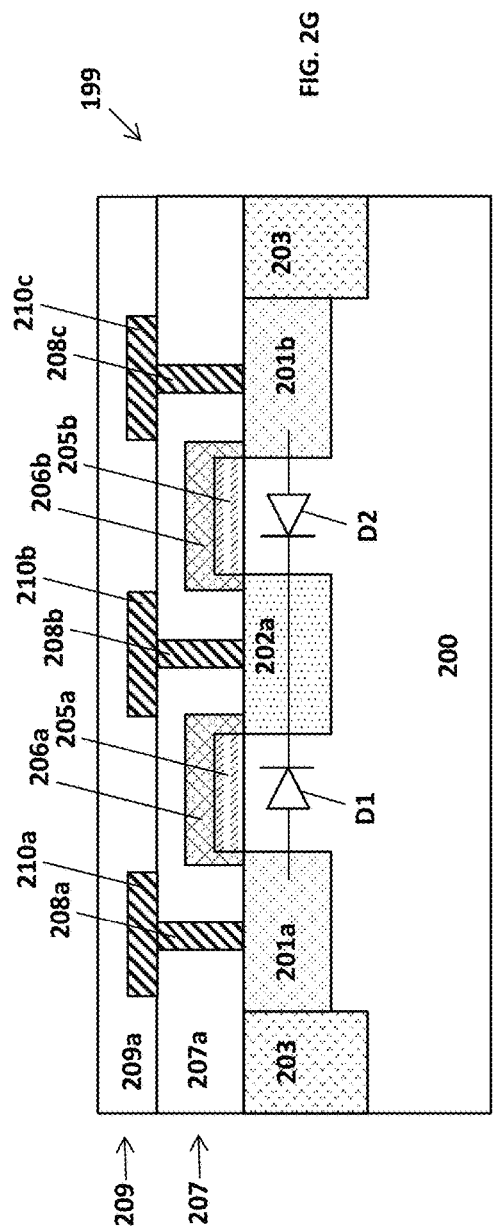
Figure 2H:
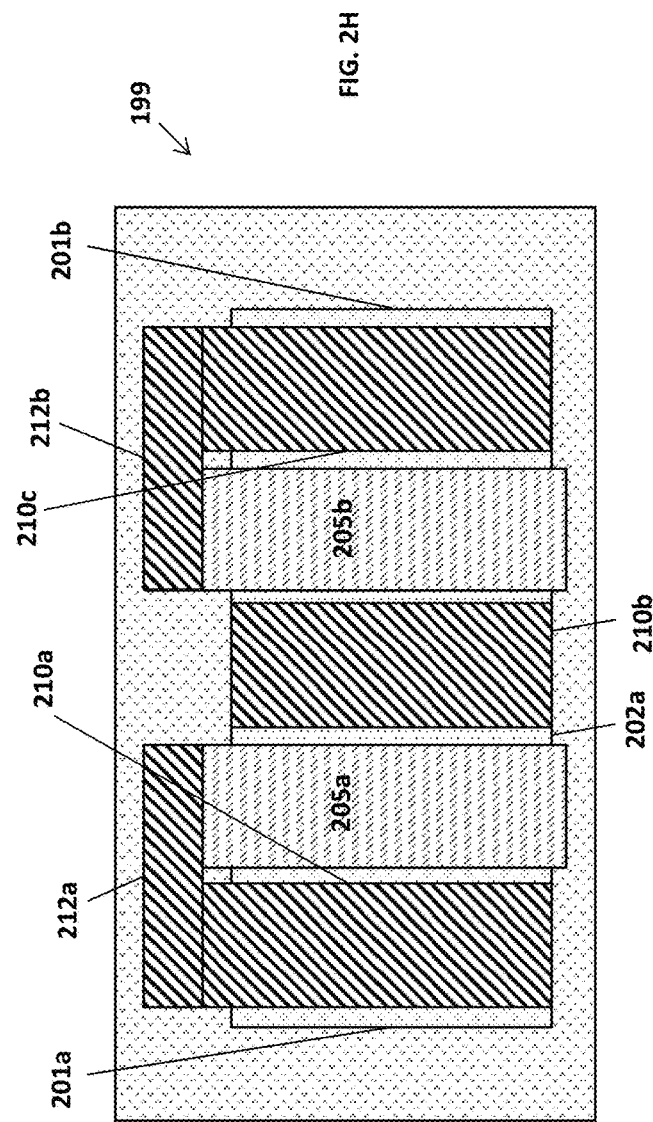

Referring now to FIGS. 2G-2H, the first metallization layer 209 is formed on the pre-metallization dielectric layer 207a. As seen in FIG. 2H, the first metallization layer 209 includes first metal lines 210a, 212a (not shown in FIG. 2G) formed in its dielectric 209a and arranged into an L-shaped structure connected to P+ region 201a and gate 205a via the contacts 208a, 191a, and second metal lines 210c, 212b formed in its dielectric 209a and arranged into an L-shaped structure connected to P+ region 201b and gate 205b via the contacts 208c, 191b. The first metallization layer 209 also includes a third metal line 210b connected to the N+ region 202a via the contact 208b. The spacing between the long-side (long-side of the L) portions of the first metal line 210a and third metal line 210b, as well as between the third metal line 210b and the long-side (long-side of the L) portions of the second metal line 210c may be, Dm2 µm, where Dm2 is approximately 2.5 times the Dm1 from the design of multi-fingered device 99. This first metallization layer 209 may be formed by, for example, depositing the metal lines 210a-210c, 212a-212b (such as aluminum or copper) on the pre-metallization dielectric layer 207a, and then depositing the dielectric layer 209a over the metal lines 210a-210c, 212a-212b and pre-metallization dielectric layer 207a.

Referring now to FIGS. 2I-2J, as can best be seen in FIG. 2J, the first metallization layer 209 includes via 211a formed in its dielectric 209a and extending upward from and connected to the metal line 210a (and thus to the P+ region 201a), via 211c formed in its dielectric 209a and extending upward from and connected to the metal line 210c (and thus to the P+ region 201b), and via 211b formed in its dielectric and extending upward from and connected to the metal line 210b (and thus to the N+ region 202a). The vias 211a-211c may be formed by planarizing the top surface of the dielectric layer 209a, forming openings which extend through the dielectric layer 209a, and then filling these openings with metal such as copper or aluminum to form the vias 211a-211c.

Referring now to FIGS. 2K-2M, the second metallization layer 215 is formed on the first metallization layer 209. The second metallization layer 215 includes a first metal line 216a formed in its dielectric 215a and connected to the via 211a of the first metallization layer 209 (and thus to the P+ region 201a), a second metal line 216c formed in its dielectric 215a and connected to the via 211c of the first metallization layer 209 (and thus to the P+ region 201b), and a third metal line 216b formed in its dielectric 215a and connected to the via 211b of the first metallization layer (and thus to the N+ region 202a). It can be noticed that the first metal line 216a and second metal line 216c of the second metallization layer 215 respectively extend beyond the metal lines 210a, 212a and 210c, 212b of the first metallization layer 209, and that the third metal line 216b extends beyond the metal line 210b of the first metallization layer 209. As can be seen in FIG. 2M, the second metallization layer 215 includes a fourth metal line 217a connecting metal lines 216a, 216c and a fifth metal line 217b connected to metal line 216b. It should be noted that the distance between the metal line 217b and 216a or 216c of second metal layer 215 is kept the same or greater than the distance between the metal line 216a or 216c and 216b of second metal layer 215. Similarly the distance between the metal line 217a and 216b of second metal layer 215 is kept same or greater than the distance between the metal line 216a or 216c and 216b of second metal layer 215.

Therefore, the multi-fingered gated-diode (N+ doped region in P-doped substrate) device 199 as shown in FIGS. 2K-2M is fully formed and complete with diodes D1-D2. The diffusion depth of the multi-fingered diode device 199 is along the Y-direction of FIG. 2K, the diffusion length of the multi-fingered diode device 199 is along the X-direction of FIG. 2K, and the diffusion width of the multi-fingered diode device 199 is along the Y-direction of FIGS. 2L-2M.

It should be noted that the structure of the multi-fingered gated-diode (an N+ doped region in a P-doped substrate) device 199 shown was shown with only two P+ regions 201a-201b and one N+ region 202a for example purposes and to keep the drawing figures legible. Actual implementations may include repeated tiling of the P+ regions 201a-201b, N+ region 202a, and other associated layers and circuitry, so that they may feature any number of P+ regions, a number of N+ regions equal to one less than the number of P+ regions, and any number of metal layers as desired to connect to other components. In addition, the multi-fingered device 199 can be rotated any which way, and need not be fabricated in the orientation pictured. Similarly, a gated-diode (P+ doped region in an n-well) device can be implemented on the same principle by swapping the P+ diffusions and N+ diffusions in the N-doped substrate (or n-well) instead in a P-doped substrate.

Comparison between the multi-fingered diode device 99 and the multi-fingered diode device 199 is now made. However, before giving the full comparison, it is noted that the largest improvement in the multi-fingered diode device 199 is due to the reduction in the overlap region between the gates 205a-205b and N+ diffusions 202a-202b compared with gates 105a-105f and N+ diffusion 102a-102c. However, the current carrying capability of the multi-fingered gated-diode 199 has not been reduced, as both the N+ diffusion area (the gated-diode junction area) and the width of the metal used for its connection has not been reduced compared to that of multi-fingered gated-diode 99.

As can readily be observed from a comparison of FIG. 1A to FIG. 2A, each N+ region of FIG. 2A is greater in area (by being wider in diffusion length) than each N+ region of FIG. 1A, but the total aggregate N+ area covered is the same. As can also be readily observed, each P+ region of FIG. 2A is greater in area (by being wider in diffusion length) than each P+ region of FIG. 1A, but the total aggregate P+ area covered is the same. The spacing between P+ and N+ regions remains the same between FIG. 1A and FIG. 2A, as does the diffusion depth.

As compared to the N+ regions 102a-102c of the multi-fingered diode device 99, therefore, for a same aggregate area of N+ regions, the number of N+ regions 202a of the multi-fingered diode device 199 is reduced. The number of gates is likewise reduced. Thus, the total N+ diffusion width in the multi-finger gated-diode 199 has drastically reduced, by keeping same diffusion area and larger diffusion length.

A first parasitic capacitance ($C_b1$) is formed between the bottom of the N+ region 202a and the p-type substrate 200 where it contacts the substrate 200 along the diffusion width and diffusion length. A second parasitic capacitance ($C_b2$) is formed between the side of the N+ region 202a and the p-type substrate 200 where it contacts the substrate 200 along the diffusion width and diffusion depth. A third parasitic capacitance ($C_b3$) is formed by the overlap between the gates 205a-205b and the N+ region 202a. Thus the parasitic capacitances $C_b2$ and $C_b3$, which are mainly driven by the N+ diffusion width (the diffusion width is approximately one order larger than both diffusion depth and diffusion length), are drastically reduced in multi-finger gated-diode 199.

Furthermore, due to the greater spacing between the portions 216a and 216c of the second metal layer 215, and between the portions 216b and 216c of the second metal layer 215 than in the second metal layer 115 of the multi-fingered diode device 99, the fringing capacitances are greatly reduced. In addition, since there is no overlap fewer overlapping points between portions of the first metal layer 209 and second metal layer 215 of the multi-fingered diode device 199, the parasitic overlap capacitance due to metal layers is zero. Therefore, as compared to the multi-fingered diode device 99, the multi-fingered diode device 199 is greatly improved in terms of reduced parasitic capacitances.

The total capacitance associated with the multi-fingered gated-diode 99 and 199 is found to be approximately 400 fF and 120 fF respectively. In the multi-fingered gated-diode 99, the contribution to total capacitance by the device (limited to Metal 1 layer) is approximately 320 fF and by the metal layers is approximately 80 fF. In the multi-fingered gated-diode 99, the contribution to total capacitance by the device (limited to the Metal 1 layer) is approximately 80 fF and by the metal layers is approximately 40 fF. Thus with this design strategy there is a reduction of approximately 75% in the parasitic capacitance due to device and approximately 50% due to the metal layers.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   a semiconductor substrate having an active area;
   first doped regions within the active area;
   second doped regions within the active area;
   wherein the first and second doped regions are separated from each other by portions of the semiconductor substrate;
   a plurality of gates over the active area, each gate extending over a portion of the semiconductor substrate separating adjacent first and second doped regions, wherein a gate width is greater than a diffusion length of the first and second doped regions;
   a first metallization layer comprising first electrical connectors between each of the first doped regions and a gate of the plurality of gates immediately adjacent to that first doped region, and second electrical connectors connected to each of the second doped regions; and
   a second metallization layer comprising:
   a different first connector connected to each first electrical connector of the first metallization layer; and
   a different second connector connected to each second electrical connector of the first metallization layer, wherein the second connector of the second metallization layer does not overlap the plurality of gates.

2. The electronic device of claim 1, further comprising a plurality of gate oxide structures respectively associated with the plurality of gates; wherein each of the plurality of gate oxide structures has a gate oxide thickness; and wherein the diffusion length of the first and second doped regions is greater than a diffusion length of other devices within the electronic device that have a same gate oxide thickness as the plurality of gate oxide structures.

3. The electronic device of claim 1, wherein the second metallization layer further comprises a third connector connected to each first connector of the second metallization layer, and a fourth connector connected to each second connector of the second metallization layer, wherein the third and fourth connectors of the second metallization layer do not overlap the plurality of gates and do not overlap the first metallization layer.

4. An electronic device, comprising:
   a) a semiconductor substrate having an active area;
   b) first doped regions within the active area;
   c) second doped regions within the active area and spaced apart from adjacent ones of the first doped regions by portions of the active area;
   d) a plurality of gates on the active area, each gate extending over a portion of the semiconductor substrate separating adjacent first and second doped regions area, wherein a gate width is greater than a diffusion length of the first and second doped regions;
   e) a pre-metallization layer on the active area and plurality of gates, the pre-metallization layer including different respective contacts for the first and second doped regions and the plurality of gates, wherein the contacts for each of the plurality of gates are located on portions of those gates that do not overlap the first and second doped regions;
   f) a first metallization layer on the pre-metallization layer, the first metallization layer including first and second metal lines, the first metal lines of the first metallization layer each being electrically connected by the contacts to a different one of the first doped regions and to its adjacent one of the plurality of gates, the second metal lines of the first metallization layer each being electrically connected by the contacts to a different one of the second doped regions; and g) a second metallization layer on the first metallization layer and comprising:
  first metal lines respectively connected to the first metal lines of the first metallization layer; and
  second metal lines respectively connected to the second metal lines of the first metallization layer;
  wherein the first metal lines of the second metallization layer extend beyond first portions of the first metallization layer in a first direction; and
  wherein the second metal lines of the second metallization layer extend beyond the second metal lines of the first metallization layer in a second direction opposite to the first direction such that the second metal lines of the second metallization layer do not overlap with the plurality of gates.

5. The electronic device of claim 4, wherein the second metallization layer further comprises:
  third metal lines respectively connected to the first metal lines of the second metallization layer at points of the first metal lines of the second metallization layer that extend beyond the first metal lines of the first metallization layer; and
  fourth metal lines respectively connected to the second metal lines of the second metallization layer at points of second portions of the second metallization layer that extend beyond the second portions of the first metallization layer.

6. The electronic device of claim 5, wherein the third and fourth metal lines of the second metallization layer do not overlap the plurality of gates, and wherein the third and fourth metal lines of the second metallization layer do not overlap the first metallization layer.

7. The electronic device of claim 4, wherein the diffusion length of the first and second doped regions is greater than a diffusion length of other devices within the electronic device that have a same gate oxide thickness.

8. The electronic device of claim 4, further comprising a shallow trench isolation formed in the semiconductor substrate and surrounding the active area.

9. The electronic device of claim 8, wherein the shallow trench isolation divides the active area into a plurality of active areas, each of the plurality of active areas containing an instance of b), c), d), e), f), and g).

10. An electronic device, comprising:
a) a semiconductor substrate;
b) a shallow trench isolation in the semiconductor substrate and surrounding an active area;
c) a first number of regions doped with a first dopant type within the active area;
d) a second number of regions doped with a second dopant type within the active area, wherein the regions doped with the second dopant type are positioned between and spaced apart from adjacent ones of the regions doped with the first dopant type;
e) a plurality of gates on the active area, each gate formed between and slightly overlapping adjacent ones of the regions doped with the first dopant type and regions doped with the second dopant type, wherein a gate width is greater than a diffusion length of the regions doped with the first dopant type and the regions doped with the second dopant type;
f) a pre-metallization layer on the active area and plurality of gates, the pre-metallization layer including different respective contacts for the regions doped with the first dopant type, regions doped with the second dopant type, and the plurality of gates, wherein the contacts for each of the plurality of gates are located on portions of those gates that do not overlap the regions doped with the first dopant type and regions doped with the second dopant type;

g) a first metallization layer on the pre-metallization layer, the first metallization layer including first and second metal lines, the first metal lines of the first metallization layer each being electrically connected by the contacts to a different region doped with the first dopant type and to its adjacent one of the plurality of gates, the second metal lines of the first metallization layer each being electrically connected by the contacts to a different region doped with the second dopant type, each first metal line of the first metallization layer having a via extending upwardly therefrom, each second metal line of the first metallization layer having a via extending upwardly therefrom; and h) a second metallization layer on the first metallization layer and comprising:
  first metal lines respectively connected to the first metal lines of the first metallization layer by the vias;
  second metal lines respectively connected to the second metal lines of the first metallization layer by the vias;
  wherein the first metal lines of the second metallization layer extend beyond the first metal lines of the first metallization layer in a first direction; and
  wherein the second metal lines of the second metallization layer extend beyond the second metal lines of the first metallization layer in a second direction opposite to the first direction such that the second metal lines of the second metallization layer do not overlap with the gates.

11. The electronic device of claim 10, wherein the diffusion length of the first and second regions is greater than a diffusion length of other devices within the electronic device that have a same gate oxide thickness.

12. The electronic device of claim 10, wherein the second metallization layer further comprises:
  third metal lines respectively connected to the first metal lines of the second metallization layer at points of the first metal lines of the second metallization layer that extend beyond the first metal lines of the first metallization layer; and
  fourth metal lines respectively connected to the second metal lines of the second metallization layer at points of the second metal lines of the second metallization layer that extend beyond the second metal lines of the first metallization layer.

13. The electronic device of claim 10, wherein the shallow trench isolation divides the active area into a plurality of active areas, each of the plurality of active areas containing an instance of b), c), d), e), f), g), and h).

14. An improvement to an electronic device including a semiconductor substrate, a shallow trench isolation formed in the semiconductor substrate and surrounding an active area, a first number of regions doped with a first dopant type formed within the active area, a second number of regions doped with a second dopant type formed within the active area, wherein the regions doped with the second dopant type are positioned between and spaced apart from adjacent ones of the regions doped with the first dopant type, a plurality of gates on the active area, each gate formed between and slightly overlapping adjacent ones of the regions doped with the first dopant type and regions doped with the second dopant type, wherein the improvement comprises:
  for a same total area consumed by the regions with the first dopant type and the regions with the second dopant type, increasing diffusion length of the regions doped with the first dopant type and of the regions doped with the second dopant type, while decreasing a number of the regions doped with the first dopant type and of the regions doped with the second dopant type.

15. The improvement to an electronic device as claimed in claim 14, wherein the electronic device also includes:
  a pre-metallization layer on the active area and the plurality of gates, the pre-metallization layer including different respective contacts for the regions doped with the first dopant type, regions doped with the second dopant type, and the plurality of gates;
  a first metallization layer on the pre-metallization layer, the first metallization layer including first and second metal lines, the first metal lines of the first metallization layer each being electrically connected by the contacts to a different region doped with the first dopant type and to its adjacent one of the plurality of gates, the second metal lines of the first metallization layer each being electrically connected by the contacts to a different region doped with the second dopant type, each first metal line of the first metallization layer having a via extending upwardly therefrom, each second metal line of the first metallization layer having a via extending upwardly therefrom; and
  a second metallization layer on the first metallization layer and comprising first metal lines respectively connected to the first metal lines of the first metallization layer by the vias and second metal lines respectively connected to the second metal lines of the first metallization layer by the vias;
  wherein the improvement further comprises:
    the contacts for each of the plurality of gates being located on portions of those gates that do not overlap the regions doped with the first dopant type and regions doped with the second dopant type.

16. The improvement to an electronic device as claimed in claim 15, wherein the improvement further comprises:
  the first metal lines of the second metallization layer extending beyond the first metal lines of the first metallization layer in a first direction; and
  the second metal lines of the second metallization layer extending beyond the second metal lines of the first metallization layer in a second direction opposite to the first direction such that the second metal lines of the second metallization layer do not overlap with the gates.

17. The improvement to an electronic device as claimed in claim 16, wherein the improvement further comprises:
  the second metallization layer having third metal lines respectively connected to the first metal lines of the second metallization layer at points of the first metal lines of the second metallization layer that extend beyond the first metal lines of the first metallization layer; and
  fourth metal lines respectively connected to the second metal lines of the second metallization layer at points of the second metal lines of the second metallization layer that extend beyond the second metal lines of the first metallization layer.

18. The improvement to an electronic device as claimed in claim 17, wherein the improvement further comprises:
  the third metal lines of the second metallization layer not overlapping the first metallization layer and not overlapping the plurality of gates; and
  the fourth metal lines of the second metallization layer not overlapping the first metallization layer and not overlapping the plurality of gates.

19. An electronic device, comprising:
  a semiconductor substrate;
  first doped regions formed within the semiconductor substrate;
  second doped regions within the semiconductor substrate;
  a plurality of gates on the semiconductor substrate, each gate formed over a portion of the semiconductor substrate between adjacent first and second doped regions;
  a first metallization layer comprising first electrical connectors between each of the first doped regions and a gate of the plurality of gates, and second electrical connectors connected to each of the second doped regions; and
  a second metallization layer comprising:
    a first electrical connector connected to each first electrical connector of the first metallization layer; and
    a second electrical connector connected to each second electrical connector of the first metallization layer, wherein the second electrical connector of the second metallization layer does not overlap the plurality of gates.

20. The electronic device of claim 19, wherein a diffusion length of the first and second doped regions is greater than a diffusion length of other devices within the electronic device that have a same gate oxide thickness.

21. The electronic device of claim 19, wherein the second metallization layer further comprises a third electrical connector connected to each first electrical connector of the second metallization layer, and a fourth electrical connector connected to each second electrical connector of the second metallization layer.

22. The electronic device of claim 21, wherein the third and fourth electrical connectors of the second metallization layer do not overlap the plurality of gates and do not overlap the first metallization layer.

23. An electronic device, comprising:
  a semiconductor substrate;
  first doped regions formed within the semiconductor substrate;
  second doped regions within the semiconductor substrate;
  a plurality of gates on the semiconductor substrate;
  a pre-metallization layer on the semiconductor substrate and plurality of gates, the pre- metallization layer including different respective contacts for the first and second doped regions and the plurality of gates;
  a first metallization layer on the pre-metallization layer, the first metallization layer including first and second metal lines, the first metal lines of the first metallization layer each being electrically connected by the contacts to a different one of the first doped regions and to its one of the plurality of gates, the second metal lines of the first metallization layer each being electrically connected by the contacts to a different one of the second doped regions; and
  a second metallization layer on the first metallization layer and comprising:
    first metal lines respectively connected to the first metal lines of the first metallization layer; and
    second metal lines respectively connected to the second metal lines of the first metallization layer;

wherein the first metal lines of the second metallization layer extend beyond first portions of the first metallization layer in a first direction; and wherein the second metal lines of the second metallization layer extend beyond the second metal lines of the first metallization layer in a second direction opposite to the first direction such that the second metal lines of the second metallization layer do not overlap with the plurality of gates.

24. The electronic device of claim 23, wherein the second metallization layer further comprises:

third metal lines respectively connected to the first metal lines of the second metallization layer; and fourth metal lines respectively connected to the second metal lines of the second metallization layer.

25. The electronic device of claim 24, wherein the third and fourth metal lines of the second metallization layer do not overlap the plurality of gates, and wherein the third and fourth metal lines of the second metallization layer do not overlap the first metallization layer.

26. The electronic device of claim 23, wherein a diffusion length of the first and second doped regions is greater than a diffusion length of other devices within the electronic device that have a same gate oxide thickness.

27. An improvement to an electronic device including a semiconductor substrate, a shallow trench isolation formed in the semiconductor substrate, a first number of regions doped with a first dopant type formed within an area surrounded by the shallow trench isolation, a second number of regions doped with a second dopant type formed within the area surrounded by the shallow trench isolation, wherein the regions doped with the second dopant type are positioned between and spaced apart from adjacent ones of the regions with the first dopant type, a plurality of gates on the area surrounded by the shallow trench isolation, each gate formed between and slightly overlapping adjacent ones of the regions doped with the first dopant type and regions with the second dopant type, wherein the improvement comprises:

for a same total area consumed by the regions doped with the first dopant type and the regions doped with the second dopant type, increasing diffusion length of the regions doped with the first dopant type and of the regions doped with the second dopant type.

28. The improvement to an electronic device as claimed in claim 27, wherein the electronic device also includes:

a pre-metallization layer on the area surrounded by the shallow trench isolation and the plurality of gates, the pre-metallization layer including different respective contacts for the regions doped with the first dopant type, regions doped with the second dopant type, and the plurality of gates;

a first metallization layer on the pre-metallization layer, the first metallization layer including first and second metal lines, the first metal lines of the first metallization layer each being electrically connected by the contacts to a different region doped with the first dopant type and to its adjacent one of the plurality of gates, the second metal lines of the first metallization layer each being electrically connected by the contacts to a different region doped with the second dopant type; and a second metallization layer on the first metallization layer and comprising first metal lines respectively connected to the first metal lines of the first metallization layer and second metal lines respectively connected to the second metal lines of the first metallization layer;

wherein the improvement further comprises:

the contacts for each of the plurality of gates being located on portions of those gates that do not overlap the regions doped with the first dopant type and regions doped with the second dopant type.

29. The improvement to an electronic device as claimed in claim 28, wherein the improvement further comprises:

the first metal lines of the second metallization layer extending beyond the first metal lines of the first metallization layer in a first direction; and the second metal lines of the second metallization layer extending beyond the second metal lines of the first metallization layer in a second direction opposite to the first direction.

30. The improvement to an electronic device as claimed in claim 29, wherein the improvement further comprises:

the second metallization layer having third metal lines respectively connected to the first metal lines of the second metallization layer at points of the first metal lines of the second metallization layer that extend beyond the first metal lines of the first metallization layer.

31. The improvement to an electronic device as claimed in claim 30, wherein the improvement further comprises:

the third metal lines of the second metallization layer not overlapping the first metallization layer and not overlapping the plurality of gates.

* * * * *